(12) United States Patent
Hong et al.

(10) Patent No.: US 11,469,278 B2
(45) Date of Patent: Oct. 11, 2022

(54) DISPLAY DEVICE INCLUDING SENSOR AREA WITH LIGHT-BLOCKING LAYER

(71) Applicant: SAMSUNG DISPLAY CO., LTD., Yongin-si (KR)

(72) Inventors: Sung Jin Hong, Seoul (KR); Seung Chan Lee, Hwaseong-si (KR); Gun Hee Kim, Seoul (KR); Dong Hyun Kim, Seoul (KR); Sang Hoon Kim, Seoul (KR); Soo Hyun Moon, Incheon (KR); Joo Hee Jeon, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 15 days.

(21) Appl. No.: 16/921,397

(22) Filed: Jul. 6, 2020

(65) Prior Publication Data
US 2021/0028252 A1    Jan. 28, 2021

(30) Foreign Application Priority Data
Jul. 26, 2019    (KR) .................. 10-2019-0091190

(51) Int. Cl.
*H01L 27/32* (2006.01)
*H01L 51/00* (2006.01)
*H01L 51/52* (2006.01)

(52) U.S. Cl.
CPC ...... *H01L 27/3234* (2013.01); *H01L 51/0097* (2013.01); *H01L 51/5284* (2013.01); *H01L 2251/5338* (2013.01)

(58) Field of Classification Search
None
See application file for complete search history.

(56) References Cited

U.S. PATENT DOCUMENTS 10,840,317 B2 * 11/2020 Oh .................... H01L 27/326
2015/0137131 A1 * 5/2015 Kim .................... H01L 51/56
257/72

(Continued)

FOREIGN PATENT DOCUMENTS

EP         3457261         3/2019
KR    10-2018-0026599      3/2018

(Continued)

OTHER PUBLICATIONS

Extended European Search Report dated Dec. 18, 2020 In Corresponding European Patent Application No. 20187289.2.

(Continued)

*Primary Examiner* — J. E. Schoenholtz
(74) *Attorney, Agent, or Firm* — F. Chau & Associates, LLC

(57) ABSTRACT

A display device is provided including a display area and a non-display area located on a periphery of the display area. The display area includes a sensor area for an optical sensor and a non-sensor area. The display device includes a substrate portion, a thin film transistor (TFT) layer disposed over an entire surface of the substrate portion, and a light emitting diode (LED) disposed on the TFT layer. The TFT layer includes at least one TFT. A thickness of the substrate portion in the sensor area is smaller than a thickness of the substrate portion in the non-sensor area.

31 Claims, 26 Drawing Sheets

(56) References Cited

U.S. PATENT DOCUMENTS

| | | | |
|---|---|---|---|
| 2018/0366529 A1 | 12/2018 | Lee et al. | |
| 2019/0205596 A1 | 7/2019 | Kim et al. | |
| 2019/0205603 A1* | 7/2019 | Lee | H01L 27/3225 |
| 2019/0220644 A1* | 7/2019 | Sun | H01L 27/3234 |
| 2020/0083304 A1* | 3/2020 | Ye | H01L 27/322 |
| 2020/0203445 A1* | 6/2020 | Ou | H01L 27/3216 |
| 2020/0287161 A1* | 9/2020 | Kim | H01L 27/326 |
| 2020/0328261 A1* | 10/2020 | Fang | H01L 27/3234 |
| 2021/0005849 A1* | 1/2021 | Zhou | H01L 51/5253 |
| 2021/0135160 A1* | 5/2021 | Sun | H01L 27/3246 |
| 2021/0357672 A1* | 11/2021 | Sun | G01J 1/4204 |

FOREIGN PATENT DOCUMENTS

| | | |
|---|---|---|
| KR | 10-2018-0076429 | 7/2018 |
| KR | 10-2019-0018120 | 2/2019 |

OTHER PUBLICATIONS

Office Action dated Jun. 24, 2022 in the European Patent Office in corresponding Application No. 20187289.2.

* cited by examiner

DISPLAY DEVICE INCLUDING SENSOR AREA WITH LIGHT-BLOCKING LAYER

CROSS-REFERENCE TO RELATED APPLICATION

This U.S. non-provisional patent application claims priority under 35 U.S.C. 119 to Korean Patent Application No. 10-2019-0091190 filed on Jul. 26, 2019 in the Korean Intellectual Property Office, the disclosure of which is incorporated by reference in its entirety herein.

BACKGROUND

1. Technical Field

The present disclosure relates to a display device.

2. Discussion of Related Art

A flat panel display (FPD) is an electronic viewing technology used to enable people to see content (e.g., still or moving images). An FPD is lighter, thinner, and uses less power than a traditional cathode ray tube (CRT) display. A FPD may include a variety of display devices such as a liquid crystal display (LCD) and an organic light-emitting display. An organic light-emitting display displays an image using an organic light-emitting diode (OLED), which generates light through recombination between an electron and a hole. An organic light-emitting display may include a plurality of transistors providing a driving current to each OLED in a display area.

A bezel of a display device may refer to a non-display area surrounding the display area. A bezel-less display device attempts to minimize or eliminate the non-display area. The size of the non-display area may be reduced by positioning sensors of the display device in the display area. However, sensors positioned in the display area do not receive as much light as those positioned in the non-display area.

SUMMARY

At least one exemplary embodiment of the present disclosure provides a display device including a camera or a sensor positioned in a display area of the display device that receive a larger amount light of light than a camera or a sensor positioned on a conventional display device.

According to an exemplary embodiment of the present disclosure, a display device is provided that includes a display area and a non-display area. The display area includes a sensor area for an optical sensor and a non-sensor area. The display device includes a substrate portion having at least one thin film transistor (TFT) layer and a light emitting diode (LED) disposed on the TFT layer. A thickness of the substrate portion in the sensor area is smaller than a thickness of the substrate portion in the non-sensor area.

In an exemplary embodiment, the substrate portion includes a first flexible substrate, a second flexible substrate facing the first flexible substrate, and a first barrier layer disposed between the first flexible substrate and the second flexible substrate.

In an exemplary embodiment, the first flexible substrate includes a through hole passing therethrough in the sensor area in a thickness direction and exposes at least part of a bottom surface of the first barrier layer.

The display device may further include a sacrificial pattern directly disposed on a region of the bottom surface of the first barrier layer exposed by the through hole.

In an exemplary embodiment, the exposed part of the bottom surface of the first barrier layer further includes a carbonized surface, and a coarseness level of the bottom surface of the first barrier layer in the sensor area is greater than a coarseness level of the bottom surface of the first barrier layer in the non-sensor area.

In an exemplary embodiment, the through hole further passes through at least part of the first barrier layer, and a thickness of the first barrier layer in the sensor area is smaller than a thickness of the first barrier layer in the non-sensor area.

A coarseness level of the bottom surface of the first barrier layer in the sensor area may be greater than a coarseness level of the bottom surface of the first barrier layer in the non-sensor area.

In an exemplary embodiment, the through hole completely passes through the first barrier layer and exposes a bottom surface of the second flexible substrate.

In an exemplary embodiment, the exposed bottom surface of the second flexible substrate further includes a carbonized surface, and a coarseness level of the bottom surface of the second flexible substrate in the sensor area is greater than a coarseness level of the bottom surface of the second flexible substrate in the non-sensor area.

In an exemplary embodiment, the through hole further passes through at least part of the second flexible substrate, and a thickness of the second flexible substrate in the sensor area is smaller than a thickness of the second flexible substrate in the non-sensor area.

A coarseness level of the bottom surface of the second flexible substrate in the sensor area may be greater than a coarseness level of the bottom surface of the second flexible substrate in the non-sensor area.

In an exemplary embodiment, the display device further includes a second barrier layer disposed between the second flexible substrate and the TFT layer, and the through hole completely passes through the second flexible substrate and exposes at least part of a bottom surface of the second barrier layer.

In an exemplary embodiment, the display device further includes a sacrificial pattern directly disposed on a region of the bottom surface of the second barrier layer exposed by the through hole.

In an exemplary embodiment, the exposed bottom surface of the second barrier layer further includes a carbonized surface, and a coarseness level of the bottom surface of the second barrier layer in the sensor area is greater than a coarseness level of the bottom surface of the second barrier layer in the non-sensor area.

In an exemplary embodiment, the through hole further passes through at least part of the second barrier layer, and a thickness of the second barrier layer in the sensor area is smaller than a thickness of the second barrier layer in the non-sensor area.

In an exemplary embodiment, the TFT layer includes a semiconductor layer disposed on the substrate portion, a gate electrode disposed on the semiconductor layer, and source/drain electrodes disposed on the gate electrode and each connected to the semiconductor layer, where the display device further includes a light-blocking metal layer disposed in the sensor area on the substrate portion.

The light-blocking layer may include a plurality of such light-blocking metal patterns arranged to be spaced apart from each other.

The plurality of light-blocking metal patterns may be overlapped with the semiconductor layer.

The light-blocking metal layer may include titanium (Ti) or molybdenum (Mo).

The substrate portion may further include a burr protruding from a periphery of the sensor area of the substrate portion.

In an exemplary embodiment, the sensor area and the non-sensor area each include a plurality of pixels, and a density of the pixels arranged in the sensor area is smaller than a density of the pixels arranged in the non-sensor area.

In an exemplary embodiment, the sensor area includes a pixel arrangement area, in which the pixels are arranged, and a transmitting area, in which the pixels are not arranged, where a conductive material is not disposed in the transmitting area.

According to an exemplary embodiment of the present disclosure, a display device is provided including a display area and a non-display area. The display area includes a sensor area for an optical sensor and a non-sensor area. The display device includes a substrate portion, a TFT layer disposed over an entire surface of the substrate portion and including at least one TFT, and an LED disposed on the TFT layer. A through hole passes through a surface of the substrate portion, in the sensor area, in a thickness direction.

In an exemplary embodiment, the display device further includes a barrier layer disposed between the substrate portion and the TFT layer and a humidity penetration blocking pattern disposed between the substrate portion and the TFT layer, where the humidity penetration blocking pattern includes silicon oxynitride.

The humidity penetration blocking pattern may be disposed in and overlapped with the sensor area.

In an exemplary embodiment, the display device further includes a barrier layer disposed between the substrate portion and the TFT layer, where the barrier layer furthers include a groove protruding further in a thickness direction than the barrier layer in the non-sensor area.

The groove may include a plurality of groove patterns arranged on a periphery of the sensor area.

The groove may completely surround the sensor area in a plan view.

BRIEF DESCRIPTION OF THE DRAWINGS

The present disclosure will become more apparent by describing exemplary embodiments thereof in detail with reference to the attached drawings, in which.

DETAILED DESCRIPTION OF THE EXEMPLARY EMBODIMENTS

Figure 1:
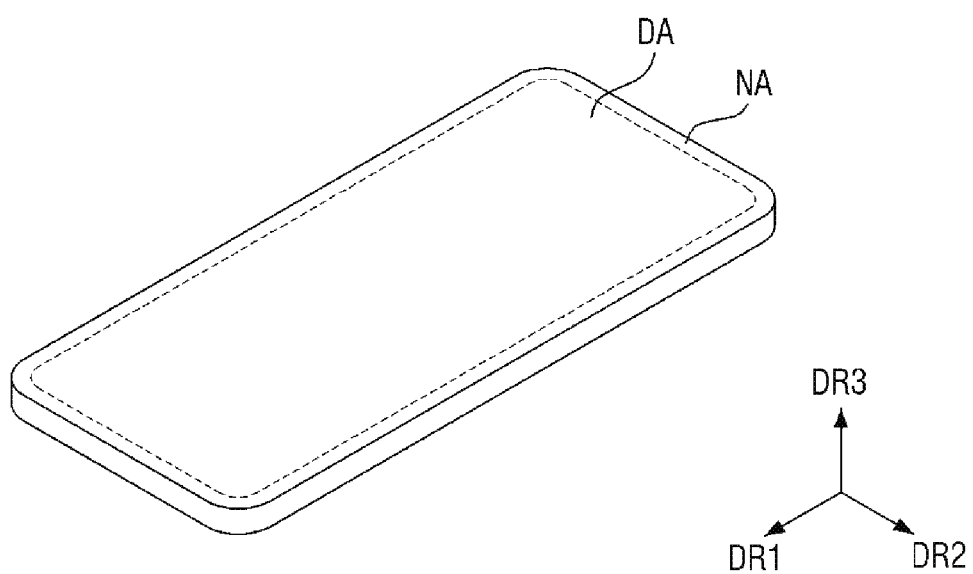
FIG. 1 is a perspective view of a display device according to an exemplary embodiment of the disclosure.

The present inventive concept and a method of achieving the same will become apparent with reference to the attached drawings in which exemplary embodiments thereof are described below in detail. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art.

As used herein, the singular forms "a", "an" and "the" are intended to include the plural forms as well, unless the context clearly indicates otherwise. It will be understood that when an element or a layer is referred to as being "on", "connected to", or coupled to another element or layer, it can be directly on, connected or coupled to the other element or layer or intervening elements or layers may be present. Throughout the specification, like reference numerals refer to like elements.

Hereinafter, exemplary embodiments of the inventive concept will be described with reference to the attached drawings. Hereinafter, an organic light-emitting display will be described as an example of a display device according to an exemplary embodiment of the inventive concept.

Figure 2:
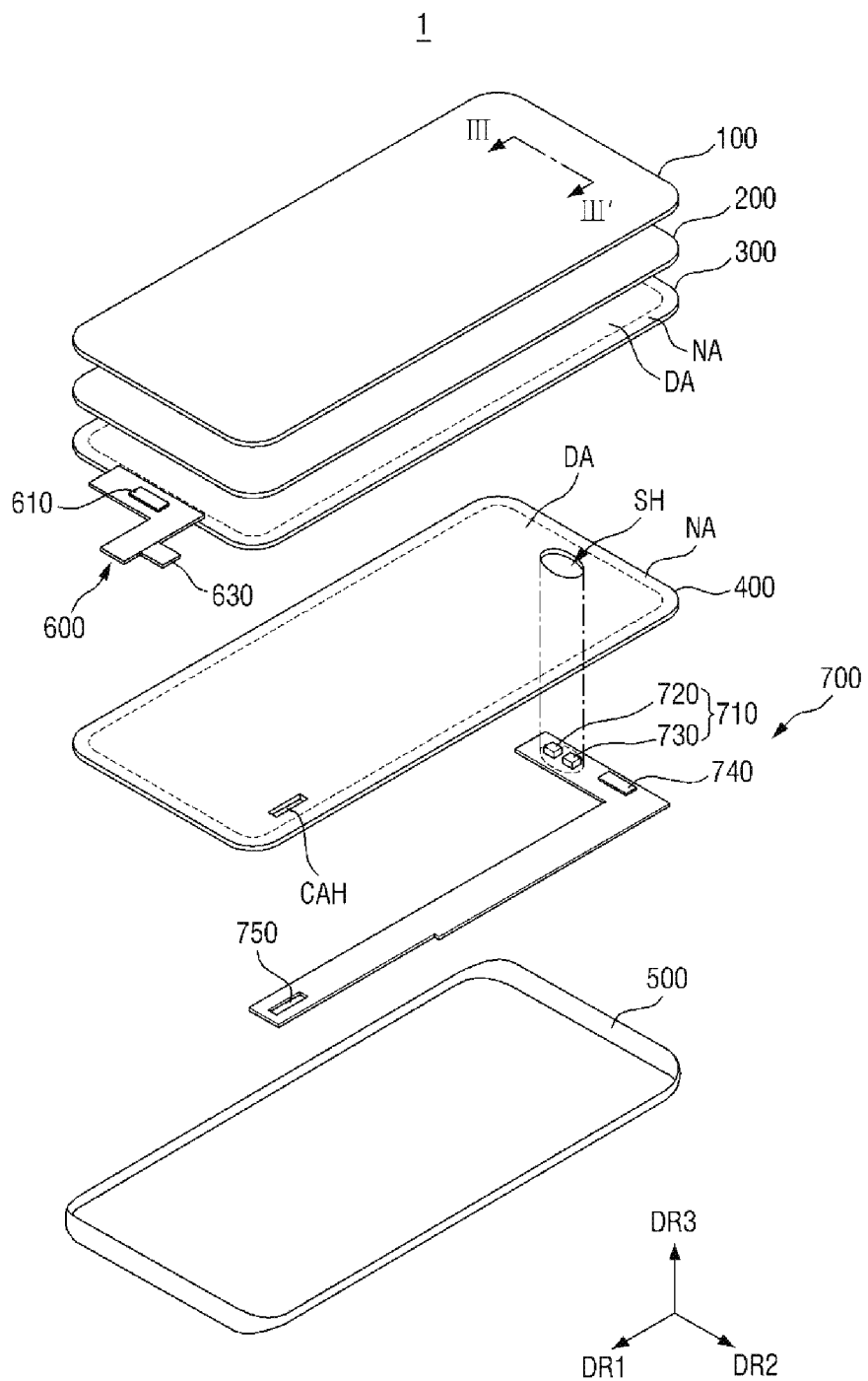
FIG. 2 is an exploded perspective view of the display device according to an exemplary embodiment of the disclosure.
Figure 3:
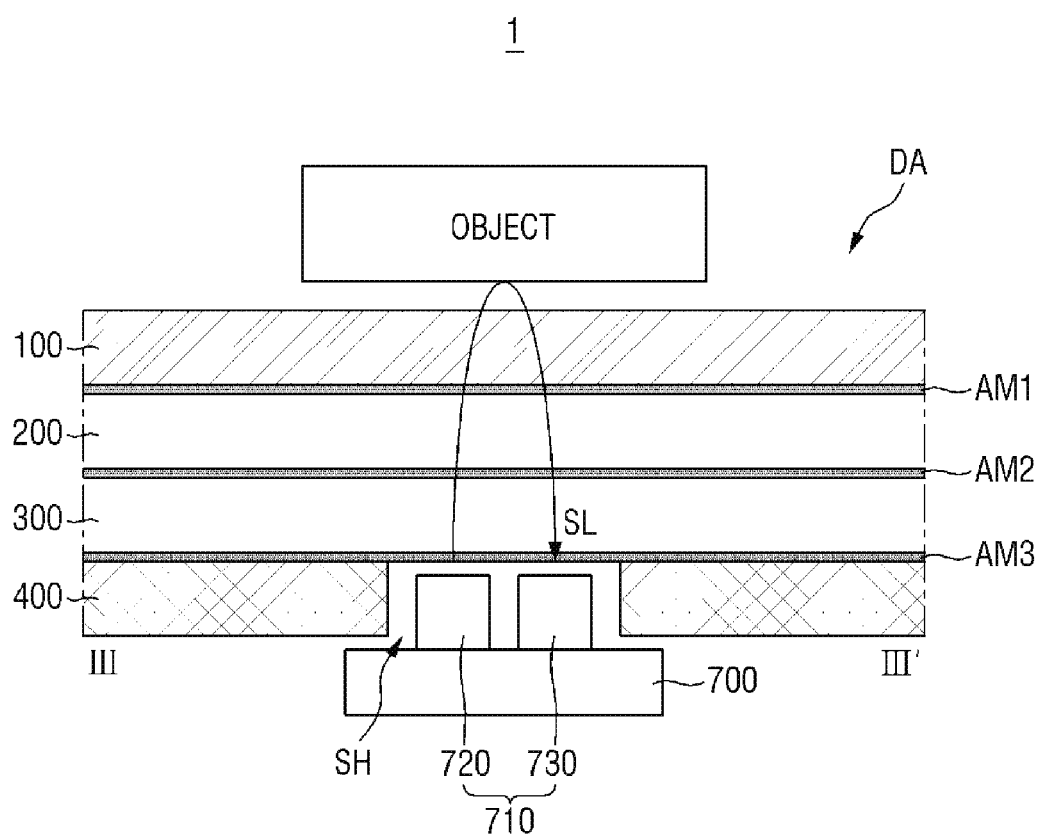
FIG. 3 is a schematic cross-sectional view taken along line III-III' in FIG. 2.
Figure 4:
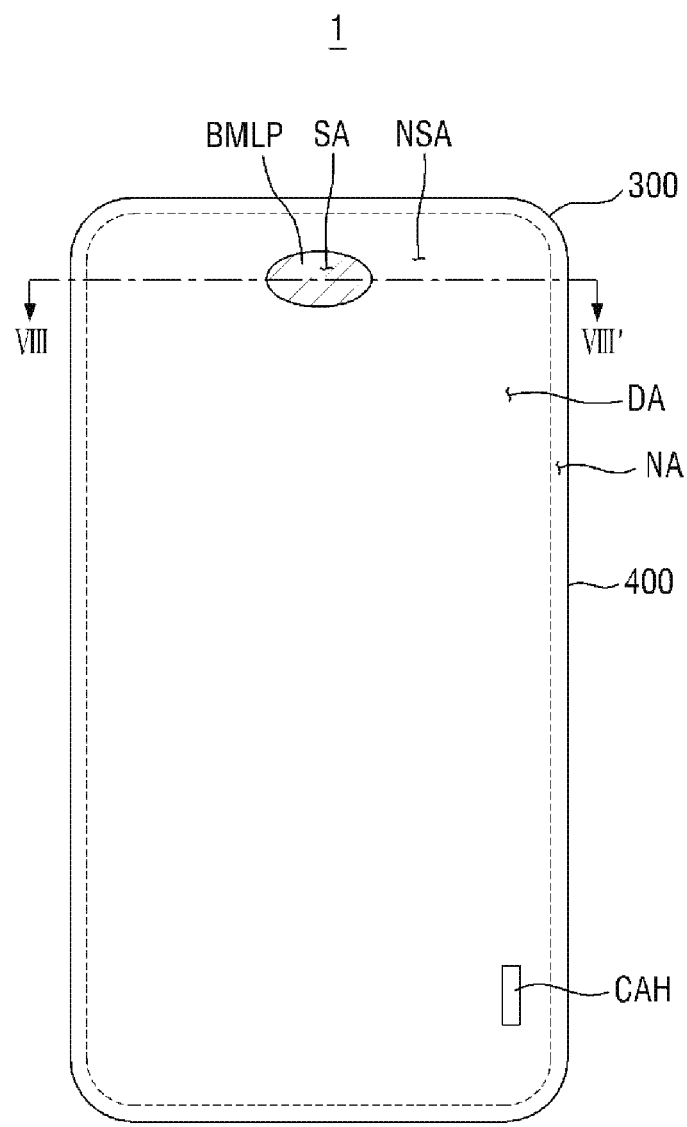
FIG. 4 is a schematic plan view illustrating a lower panel sheet and a display panel.

FIG. 1 is a perspective view of a display device according to an exemplary embodiment of the inventive concept, FIG. 2 is an exploded perspective view of the display device according to an exemplary embodiment of the inventive concept, FIG. 3 is a schematic cross-sectional view taken along line III-III' in FIG. 2, and FIG. 4 is a schematic plan view illustrating a lower panel sheet and a display panel.

In the specification, the terms "above," "top," and "top surface" indicate a direction in which a window 100 is disposed on the basis of a display panel 300, which will be described below, that is, one side direction of a third direction DR3 and the terms "below," "bottom," and "bottom surface" indicate a direction in which a lower frame 500 is disposed on the basis of the display panel 300, that is, the other side direction of the third direction DR3.

Referring to FIGS. 1 to 4, a display device 1 according to an exemplary embodiment of the inventive concept includes the window 100, a touch member 200 disposed below the window 100, the display panel 300 disposed below the touch member 200, a display circuit board 600 attached to the display panel 300, a display driving portion 610 disposed on the display circuit board 600, a cover panel 400 disposed below the display panel 300, a main circuit board 700 disposed below the cover panel 400 and including a second connector 750 physically connected to a first connector 630 of the display circuit board 600, an optical sensor 710 and a main driving portion 740 arranged on the main circuit board 700, and the lower frame 500.

The display device 1 may have a rectangular shape in a plane. For example, the display device 1 may have a flat rectangular shape having long sides in a first direction DR1 and short sides in a second direction DR2 as shown in FIGS. 1 and 2. For example, the short sides may be shorter than the long sides. A corner where the long side in the first direction meets the short side in the second direction may be formed to be rounded with a certain curvature or to be rectangular. A plane shape of the display device 1 is not limited to a rectangular shape and may be formed as another polygonal shape, a circular shape, or an elliptical shape.

The window 100 may be disposed above the display panel 300 to cover a top surface of the display panel 300. Accordingly, the window 100 may perform a function of protecting the top surface of the display panel 300. The window 100 may be formed of glass, sapphire, and/or plastic. The window 100 may be formed to be rigid or flexible. For example, the window 100 may be formed of a transparent or translucent material.

The touch member 200 may be disposed between the window 100 and the display panel 300. The touch member 200 is a device for sensing a position of a user's touch and may be implemented by a capacitance type device such as a self capacitance type device or a mutual capacitance type device. The touch member 200 may be formed to have a panel shape or a film shape. For example, the touch member 200 may have a flat rectangular shape. Otherwise, the touch member 200 may be integrally formed with the display panel 300. In this case, touch driving electrodes and touch sensing electrodes of the touch member 200 may be formed on a thin encapsulation film of the display panel 300. Although not shown in the drawings, a touch circuit board including a touch driving portion electrically connected to the touch driving electrodes and the touch sensing electrodes of the touch member 200 may be attached to one side of the touch member 200. The touch circuit board may be a flexible printed circuit board (FPCB). The touch driving portion may be formed as an integrated circuit.

For example, the display panel 300 may be implemented by an organic light-emitting display panel. While the display panel 300 is described as being implemented by an organic light-emitting display panel below, embodiments of the present disclosure are not limited thereto. For example, the display panel 300 may be implemented by other types of display panels such as a liquid crystal display (LCD), a quantum dot organic light emitting diode (QD-OLED) display panel, a QD-LCD, a quantum nano light emitting diode (LED), or a micro LED.

The display panel 300 includes a display area DA including a plurality of pixels that display an image and a non-display area NA located on a periphery of the display area DA. In an exemplary embodiment, the display panel 300 includes a substrate portion, a thin film transistor (TFT) layer including a plurality of TFTs arranged on the substrate portion, an anode electrode electrically connected to the TFT layer, a cathode electrode facing the anode electrode, an LED layer including an organic emissive layer disposed between the anode electrode and the cathode electrode, and an encapsulation layer disposed on the LED layer. Each pixel may include a plurality of TFTs and a plurality of LEDs of the LED layer. When voltages are applied to the anode electrode and the cathode electrode, holes and electrons are transferred to the organic emissive layer through a hole transport layer and an electron transport layer, respectively, and are coupled with each other and emit light at the organic emissive layer. A detailed cross-sectional shape of the display panel 300 will be described below.

The encapsulation layer is disposed on the LED layer. The encapsulation layer may prevent air (e.g., oxygen) or humidity (e.g., moisture) from penetrating through the LED layer. The encapsulation layer may include at least one inorganic film and at least one organic film.

A display circuit board 600 may be attached to one side of the display panel 300. In an exemplary embodiment, the display circuit board 600 is attached to pads provided on one side of the display panel 300 using an anisotropy conductive film. In an exemplary embodiment, the display circuit board 600 is attached to one side of the display panel 300 through ultrasonic bonding. The display driving portion 610 (e.g., a circuit) outputs signals and voltages for driving the display panel 300 through the display circuit board 600. The display driving portion 610 may be implemented by an integrated circuit and mounted on the display circuit board 600 but is not limited thereto. For example, the display driving portion 610 may be attached to one side of a top surface or a bottom surface of a substrate of the display panel 300.

The lower cover panel 400 is disposed below the display panel 300. The lower cover panel 400 includes at least one functional layer. The functional layer may be a layer which performs a heat dissipation function, an electromagnetic wave blocking function, a grounding function, a buffering function, a reinforcing function, a supporting function, or a digitizing function. The functional layer may be a sheet layer formed of a sheet, a film layer formed of a film, a thin film layer, a coating layer, a panel, or a plate. One functional layer may be formed as a single layer but may be formed of a plurality of stacked thin films or coating layers. The functional layer may be, for example, a support member, a heat dissipation layer, an electromagnetic wave blocking layer, a shock-absorbing layer, or a digitizer.

The lower cover panel 400 includes a cable hole CAH in which a first connector 630 of the display circuit board 600 passes in a thickness direction and a sensor hole SH which exposes the optical sensor 710 disposed on the main circuit board 700. The lower cover panel 400 includes the sensor hole SH exposing the optical sensor 710 so that the optical sensor 710 is able to advance toward a display surface. The cable hole CAH and the sensor hole SH may be through-holes in the lower cover panel 400.

The main circuit board 700 physically connected to the display circuit board 600 may be disposed below the lower cover panel 400. The main driving portion 740 (e.g., a circuit) disposed on the main circuit board 700 may perform a function of controlling the above-described display driving portion 610.

In an exemplary embodiment, a first optical transparent adhesive member AM1 is disposed between the window 100 and the touch member 200, a second optical transparent adhesive member AM2 is disposed between the touch member 200 and the display panel 300, and a third optical transparent adhesive member AM3 is disposed between the display panel 300 and the lower cover panel 400. Each of the optical transparent adhesive members AM1, AM2, and AM3 may couple adjacent members to each other. Each of the optical transparent adhesive members AM1, AM2, and AM3 may be implemented by at least one of an optical transparent adhesive film, optical transparent adhesive tape, and an optical transparent resin. According to an exemplary embodiment of the inventive concept, each of the first optical transparent adhesive member AM1 and the second optical transparent adhesive member AM2 have an optical transparency higher than the third optical transparent adhesive member AM3. In this case, when the display device 1 is a top emissive display device, optical transparency of light emitted from the display panel 300 toward the display surface may be improved.

However, the present disclosure is not limited thereto since each of the first optical transparent adhesive member AM1 and the second optical transparent adhesive member AM2 may have an optical transparency equal to the third optical transparent adhesive member AM3 in an alternate embodiment.

In an exemplary embodiment, the optical sensor 710 includes a light transmitting portion 720 and a light receiving portion 730 as shown in FIGS. 2 and 3. The light transmitting portion 720 emits sensor light SL in an upward direction through the sensor hole SH of the lower cover panel 400. The sensor light SL emitted from the light transmitting portion 720 may pass through an upper structure (including the display panel 300, the touch member 200, and the window 100) and come into contact with an object, and at least a part of the sensor light SL may be reflected from the object and become incident on the light receiving portion 730.

In an exemplary embodiment, the optical sensor is implemented by a facial recognition device, a fingerprint recognition device, an infrared camera, or an optical light camera which uses light. In one embodiment, the optical sensor 710 may be a camera device.

The sensor light SL emitted from the light sensor 710 is emitted from the light transmitting portion 720, is reflected by the object, and then is incident on the light receiving portion 730 as described above. Here, the light incident on the light receiving portion 730 is recognized by the optical sensor 710 such that a shape of the object may be determined. That is, as a quantity of the sensor light SL emitted from the optical sensor 710 and a quantity of the incident sensor light SL increase, a degree of definition of an acquired image may increase or the optical sensor 710 may operate more efficiently. In an exemplary embodiment, the light transmitting portion 720 is a light source such as an LED or and OLED and the light receiving portion 730 is a photodiode.

However, due to the upper structure, particularly, due to a material of the substrate portion of the display panel 300, a desired quantity of the sensor light SL emitted from the optical sensor 710 may not reach the object or at least part of the sensor light SL reflected by the object may not be incident on the light receiving portion 730. According to an exemplary embodiment of the disclosure, the display device 1 has a shape in which the substrate portion of the display panel 300 penetrates into an area in which the optical sensor 710 is disposed. For example, a shape of the substrate portion enables the light transmitting portion 720 and the light receiving portion 730 to penetrate into an interior of the substrate portion.

Referring to FIG. 4, the display area DA of the display device 1 includes an optical sensor disposition area SA (e.g., a sensor area) in which the optical sensor 710 is disposed and an optical sensor non-disposition area NSA (e.g., a non-sensor area) which is disposed on a periphery of the optical sensor disposition area SA and in which the optical sensor 710 is not disposed.

Also, the display area DA may further include a light-blocking metal pattern arrangement area BMLP positioned to overlap with the optical sensor disposition area SA. In an exemplary embodiment, one or more light-blocking metal patterns, which will be described below, are arranged in the light-blocking metal pattern disposition area BMLP. The light-blocking metal patterns may be arranged to be spaced apart from each other.

Figure 5:
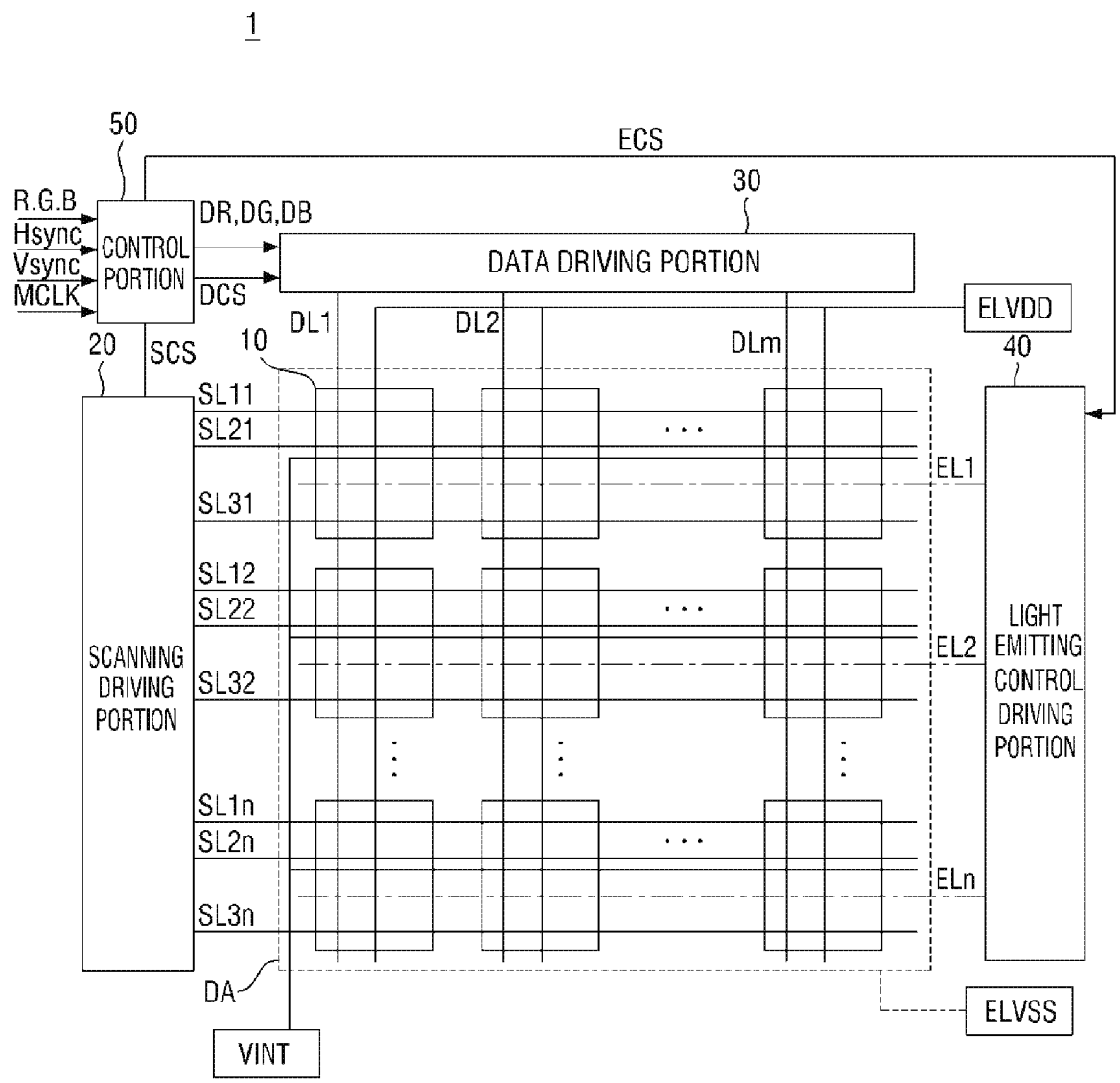
FIG. 5 is a schematic block diagram of the display device according to an exemplary embodiment of the disclosure.

FIG. 5 is a schematic block diagram of the display device according to an exemplary embodiment.

Referring to FIG. 5, the display device 1 includes the display area DA including a plurality of pixels 10, a scanning driving portion 20 (e.g., a scan or gate driving circuit), a data driving portion 30 (610 in FIG. 2), a light-emitting control driving portion 40 (e.g., a control circuit), and a control portion 50 (e.g., a timing controller or control circuit). The control portion 50 performs a function of controlling the scanning driving portion 20, the data driving portion 30, and the light-emitting control driving portion 40. The control portion 50 may be the main driving portion 740 of FIG. 2. The data driving portion 30 may be a data or source driving circuit.

The display area DA includes a plurality of pixels 10 arranged in a matrix shape while being located at intersections of a plurality of scanning lines SL11 to SL1$n$, SL21 to SL2$n$, and SL31 to SL3$n$ ($n$ is greater than or equal to 2), a plurality of data lines DL1 to DL$m$ ($m$ is greater than or equal to 2), and a plurality of light-emitting control lines EL1 to EL$n$.

The pluralities of scanning lines SL11 to SL1$n$, SL21 to SL2$n$, and SL31 to SL3$n$ and the plurality of light-emitting control lines EL1 to EL$n$ may extend in a row direction, and the plurality of data lines DL1 to DL$m$ may extend in a column direction. The row direction and the column direction may be switched with each other. An initialization voltage supply line supplying an initialization voltage VINT may diverge for each row and may extend in the row direction, and a first power voltage supply line supplying a power voltage ELVDD may diverge for each column and may extend in the column direction. However, the present disclosure is not limited thereto, and extending directions of the initialization voltage supply line and the first power voltage supply line may be diversely modified.

Three scanning lines SL11, SL21, and SL31, one data line DL1, one light-emitting control line EL1, one initialization power voltage supply line, and one first power voltage supply line may pass through a pixel at a first row and a first column as an example. The corresponding lines may pass through other pixels.

The scanning driving portion 20 generates and transmits three scanning signals to each pixel through the pluralities of scanning lines SL11 to SL1n, SL21 to SL2n, and SL31 to SL3n. That is, the scanning driving portion 20 sequentially supplies scanning signals to the first scanning lines SL11 to SL1n, the second scanning lines SL21 to SL2n, or the third scanning lines SL31 to SL3n.

The data driving portion 30 transmits a data signal to each pixel 10 through the plurality of data lines DL1 to DLm. Whenever a second scanning signal is supplied through the first scanning lines SL11 to SL1n, the data signal is supplied to the pixel 10 selected by the second scanning signal.

The light-emitting control driving portion 40 generates and transmits a light-emitting control signal to each pixel 10 through a plurality of light-emitting control lines EL1 to ELn. The light-emitting control signal controls a light emitting time of the pixel 10. The light-emitting control driving portion 40 may be omitted depending on an internal structure of the pixel 10 or when the scanning driving portion 20 generates both the scanning signals and the light-emitting control signals.

The control portion 50 may receive a plurality of image signals R, G, and B from the outside and convert the received image signals into a plurality of image data signals DR, DG, and DB for transmission to the data driving portion 30. The control portion 50 may receive a vertical synchronizing signal Vsync, a horizontal synchronizing signal Hsync, and a clock signal MCLK and generate and transmit control signals for controlling driving of the scanning driving portion 20, the data driving portion 30, and the light-emitting control driving portion 40 to each thereof. That is, the control portion 50 generates and transmits a scanning driving control signal SCS controlling the scanning driving portion 20, a data driving control signal DCS controlling the data driving portion 30, and a light-emitting driving control signal ECS controlling the light-emitting control driving portion 40.

Each of the plurality of pixels 10 receives a first power voltage ELVDD and a second power voltage ELVSS. The first power voltage ELVDD may be a certain high level voltage, and the second power voltage ELVSS may be a voltage lower than the first power voltage ELVDD.

Each of the plurality of pixels 10 emits light having a certain brightness level due to a driving current supplied to a light source (e.g., an LED) of the corresponding pixel according to the data signal transmitted through the plurality of data lines DL1 to DLm.

The first power voltage ELVDD, the second power voltage ELVSS, and the initialization voltage VINT may be supplied from an external voltage source (e.g., a voltage generator).

Figure 6:
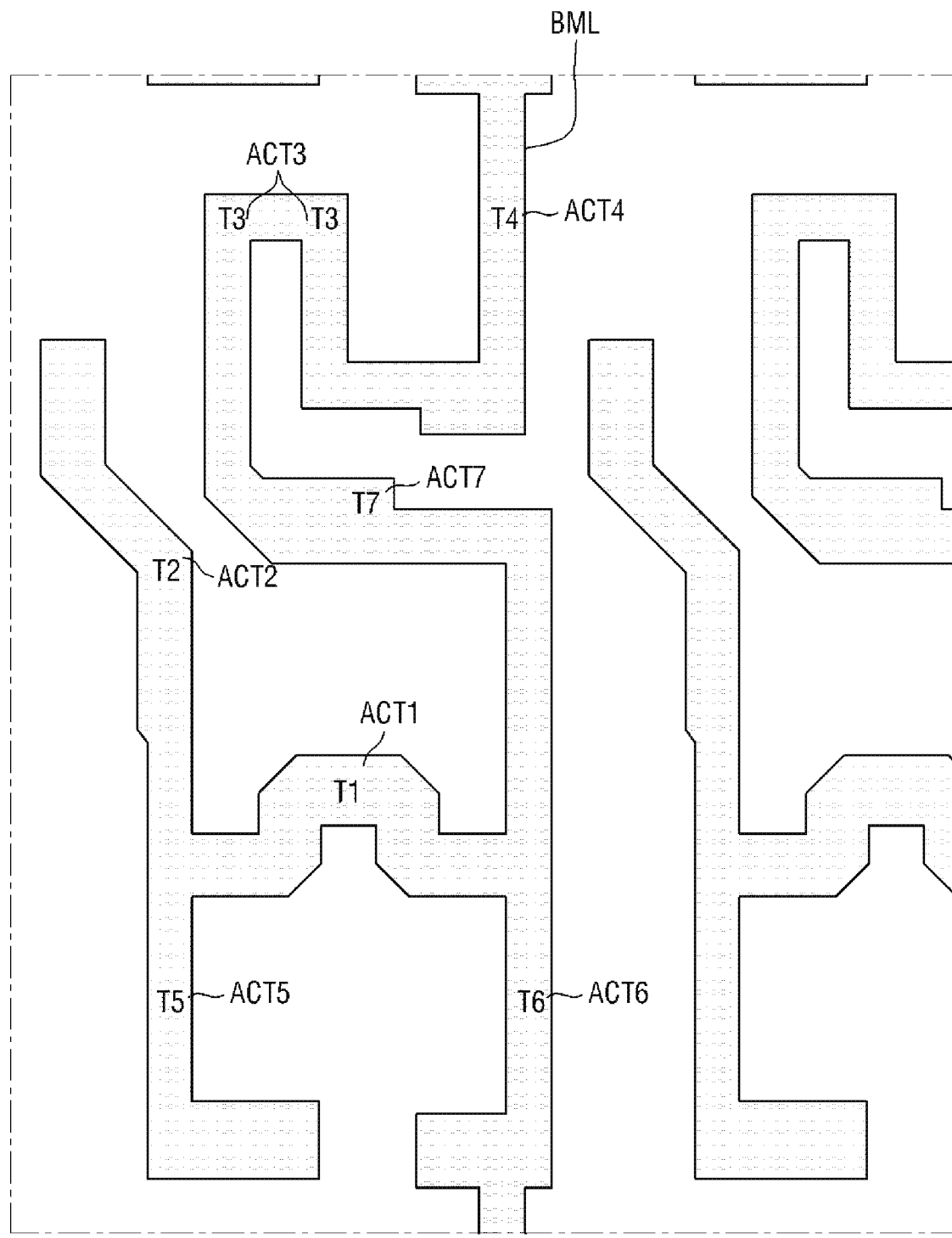
FIG. 6 is a layout view illustrating a semiconductor layer and a light blocking metal pattern.

FIG. 6 is a layout view illustrating a semiconductor layer and a light blocking metal pattern. FIG. 6 illustrates a layout view of a pixel semiconductor layer and a light blocking metal pattern arranged in the sensor disposition area SA of the display panel 300 according to an exemplary embodiment of the inventive concept.

The pixel 10 of the display device 1 according to an embodiment may include at least one transistor. The at least one transistor may include, for example, a first transistor T1 to a seventh transistor T7. For example, the first transistor T1 may be a driving transistor, and a second transistor T2 to the seventh transistor T7 may be switching transistors.

A semiconductor layer ACT may form a channel of the transistors T1 to T7. The semiconductor layer ACT may be separated for each pixel. The semiconductor layer ACT may have a particular pattern in a plane. In an exemplary embodiment, the semiconductor layer ACT is integrally formed. In an exemplary embodiment, the semiconductor layer ACT may be formed to be disposed on a plurality of layers but is not limited thereto. The semiconductor layer ACT may include a first semiconductor layer ACT1 which is a channel of the first transistor T1, a second semiconductor layer ACT2 which is a channel of the second transistor T2, a third semiconductor layer ACT3 which is a channel of the third transistor T3, a fourth semiconductor layer ACT4 which is a channel of the fourth transistor T4, a fifth semiconductor layer ACT5 which is a channel of the fifth transistor T5, a sixth semiconductor layer ACT6 which is a channel of the sixth transistor T6, and a seventh semiconductor layer ACT7 which is a channel of the seventh transistor T7.

As shown in FIG. 6, the semiconductor layers ACT1 to ACT7 may include a first longitudinal portion and a second longitudinal portion generally extending in a row direction, a lateral portion generally extending in a column direction, and a bending portion (e.g., a bent portion) extending from the second longitudinal portion in a row direction. The first longitudinal portion, the second longitudinal portion, the lateral portion, and the bending portion may be physically connected to one another.

The first longitudinal portion may be disposed to be adjacent to a left side of a pixel, and the second longitudinal portion may be disposed to be adjacent to a right side of the pixel. The first longitudinal portion and the second longitudinal portion may be disposed to be spaced apart from each other. The lateral portion may connect intermediate parts between the first longitudinal portion and the second longitudinal portion. In the specification, the term "upper parts" of the first longitudinal portion and the second longitudinal portion may refer to parts located above parts connected to the lateral portion in a plane and the term "lower parts" may refer to parts located below the parts connected to the lateral portion in a plane. A planar shape of the semiconductor layer ACT may have a shape approximately similar to an "H."

The second semiconductor layer ACT2 may be disposed at the upper part of the first longitudinal portion, and the fifth semiconductor layer ACT5 may be disposed at the lower part of the first longitudinal portion. The sixth semiconductor layer ACT6 may be disposed at the upper part and the lower part of the second longitudinal portion. The fourth semiconductor layer ACT4 may be disposed at a lower part of the sixth semiconductor layer ACT6. The first semiconductor layer ACT1 may be disposed at the lateral portion.

The bending portion of the semiconductor layer ACT may include a first sub-lateral portion formed along a left row direction, a first sub-longitudinal portion formed along an upper row direction of the first sub-lateral portion, a second sub-lateral portion formed along a right row direction of the first sub-longitudinal portion, and a second sub-longitudinal portion formed along a lower row direction of the second sub-lateral portion. The seventh semiconductor layer ACTT may be disposed at the first sub-lateral portion, and the third semiconductor layer ACT3 may be disposed at the first sub-longitudinal portion, the second sub-lateral portion, and the second sub-longitudinal portion.

The semiconductor layer ACT may include polycrystalline silicon. The polycrystalline silicon may be formed by crystallizing amorphous silicon. A method of the crystallizing may include, for example, a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method, but is not limited thereto. As another example, the semiconductor layer ACT may include single-crystalline silicon, low-temperature polycrystalline silicon, or amorphous silicon.

A part (source/drain area) connected to a source/drain electrode of each of the transistors T1 to T7 in the semiconductor layer ACT may be doped with p-type impurity ions in the case of a p-type metal oxide semiconductor (PMOS) field effect transistor. A trivalent dopant such as boron (B) may be used as the p-type impurity ions. The semiconductor layer ACT may be a channel area of each of the transistors T1 to T7.

In another embodiment, the semiconductor layer ACT may be an oxide semiconductor. When the semiconductor layer ACT is formed of an oxide semiconductor, a material such as indium-gallium-zinc oxide (IGZO), zinc-tin oxide (ZTO), or indium-tin oxide (IZO) may be used.

A light-blocking metal pattern BML may be disposed in the light-blocking metal pattern disposition area BMLP of FIG. 4.

In an exemplary embodiment, the light-blocking metal pattern BML is not disposed on an entire surface of the substrate portion but is disposed on a part thereof. As described above, the light-blocking metal pattern BML is disposed only in the sensor area SA of the display panel 300 and is not disposed in the non-sensor area NSA. That is, the light-blocking metal pattern disposition area BMLP may be disposed to be overlapped with the sensor area SA of the display panel 300.

The light-blocking metal pattern BML may be disposed to be generally overlapped with the semiconductor layer ACT disposed in the sensor area SA in a thickness direction. That is, the light-blocking metal pattern BML may have a planar shape substantially equal to that of the semiconductor layer ACT disposed in the sensor area SA. In an exemplary embodiment, a process of manufacturing the light-blocking metal pattern BML is performed using a mask having the same pattern as that of the semiconductor layer ACT disposed in the sensor area SA.

In an exemplary embodiment, a planar size of the light-blocking metal pattern BML is greater than a planar size of the semiconductor layer ACT disposed in the sensor area SA. That is, the light-blocking metal pattern BML may be disposed to cover the semiconductor layer ACT disposed in the sensor area SA in the thickness direction and extend outward further.

The light-blocking metal pattern BML is disposed to be overlapped with the semiconductor layer ACT disposed in the sensor area SA such that light emitted from the light transmitting portion 720 of the optical sensor 710 and light incident on the light receiving portion 730 may be prevented from entering the semiconductor layer ACT.

The light-blocking metal pattern BML may include at least one selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and copper (Cu). The light-blocking metal pattern BML may be a single layer or a multi-layer. For example, the light-blocking metal pattern BML may have a stacked structure such as Ti/Al/Ti, Mo/Al/Mo, Mo/AlGe/Mo, or Ti/Cu.

In an exemplary embodiment, the light-blocking metal pattern BML includes Ti or Mo. When the light-blocking metal pattern BML according to an exemplary embodiment includes Ti, humidity or moisture which flows in through a through hole may be easily absorbed. When the light-blocking metal pattern BML includes Ti, the light-blocking metal pattern BML may be present in the form of Ti-oxide (TiOx).

Hereinafter, a more detailed cross-sectional structure of the display panel 300 will be described.

Figure 7:
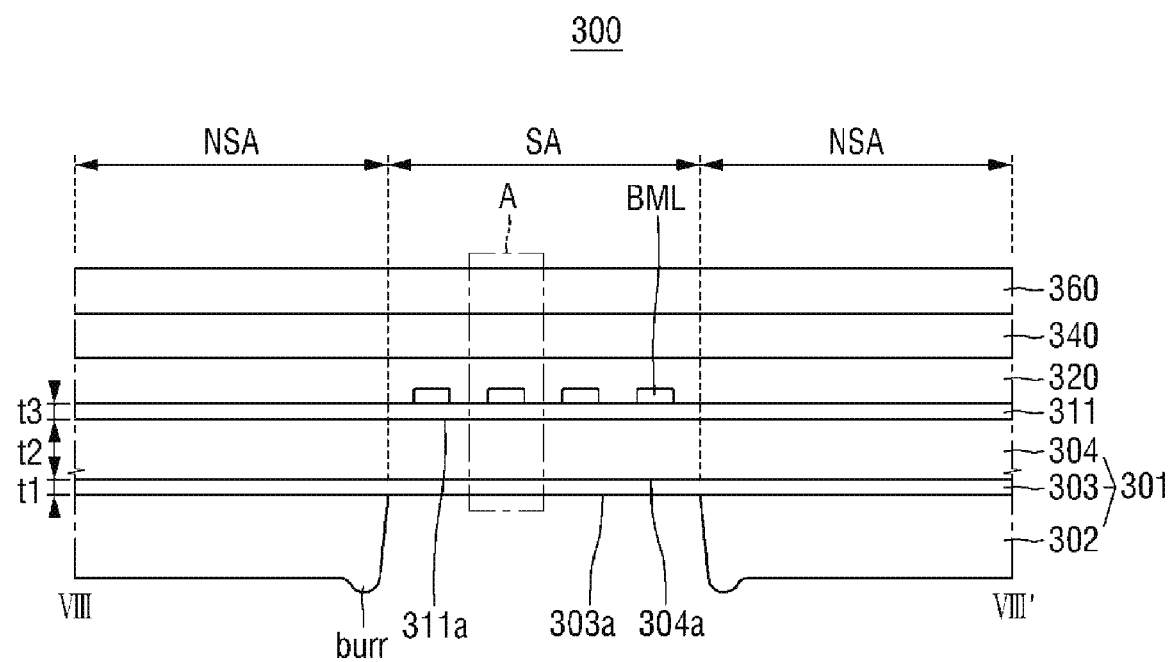
FIG. 7 is a cross-sectional view taken along line VIII-VIII' of FIG. 4.
Figure 8:
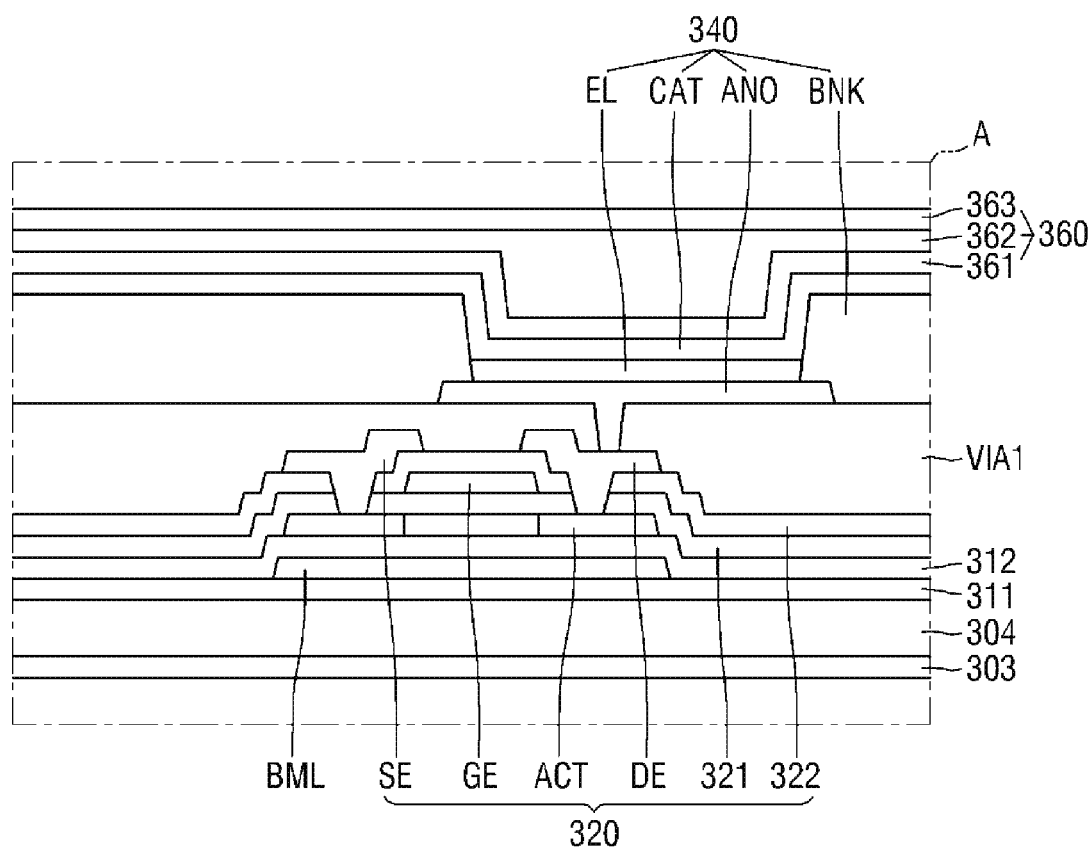
FIG. 8 is an enlarged view illustrating area A of FIG. 7.

FIG. 7 is a cross-sectional view taken along line VIII-VIII' of FIG. 4, and FIG. 8 is an enlarged view illustrating area A of FIG. 7.

Referring to FIGS. 7 and 8, the display panel 300 includes a substrate portion 301, a TFT layer 320 including first to seventh TFTs T1 to T7 arranged on the substrate portion 301, an LED layer 340 disposed on the TFT layer 320, and an encapsulation layer 360 disposed on the LED layer 340. While the TFT layer 320 is described as including seven TFTs, embodiments of the disclosure are not limited thereto as a lessor number of TFTs may be present.

In an exemplary embodiment, the substrate portion 301 of the display panel 300 is disposed over the sensor area SA and the non-sensor area NSA.

The substrate portion 301 of the display panel 300 includes a first support substrate 302 or a first flexible substrate, a second support substrate 304 or a second flexible substrate disposed on the first support substrate 302, and a first barrier layer 303 disposed between the first support substrate 302 and the second support substrate 304. The first support substrate 302 and the second support substrate 304 may be flexible substrates as described above. For example, the first support substrate 302 and the second support substrate 304 may each be one of a film substrate and a plastic substrate which include a polymer organic material. For example, the first support substrate 302 and the second support substrate 304 may include one of polystyrene, polyvinyl alcohol, poly(methyl methacrylate), polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. Also, the substrate portion 301 may include fiber glass reinforced plastic (FRP). In an exemplary embodiment, the first support substrate 302 and the second support substrate 304 include polyimide. In general, the polyimide is seen as yellow with the naked eye. The optical sensor 710 emits light within a range of a visible ray wavelength or an ultraviolet or infrared wavelength close to the visible ray wavelength or absorbs light within a blue wavelength range when the light reflected by the object is within the corresponding wavelength range. This may cause degradation in a function of the optical sensor 710.

The first barrier layer 303 is disposed between the first support substrate 302 and the second support substrate 304. The first barrier layer 303 may couple the first support substrate 302 with the second support substrate 304 and may planarize the first and second support substrates 302 and 304 including organic materials. The first barrier layer 303 may include an inorganic material. The first barrier layer 303 may include a plurality of stacked films. For example, the first barrier layer 303 may include two stacked films. In an exemplary embodiment, the first barrier layer 303 is entirely an inorganic material.

In an exemplary embodiment, the first barrier layer 303 is disposed on the first support substrate 302 over the sensor area SA and the non-sensor area NSA. The first barrier layer 303 has a first thickness t1.

In an exemplary embodiment, the second support substrate 304 is disposed on the first support substrate 302 over the sensor area SA and the non-sensor area NSA. The second support substrate 304 has a second thickness t2. In an exemplary embodiment, the second thickness t2 is larger than the first thickness t1.

The display panel 300 further includes a second barrier layer 311 disposed between the substrate portion 301 and the TFT layer 320. In an embodiment, the second barrier layer 311 includes an inorganic material. In an embodiment, the second barrier layer 311 is entirely an inorganic material.

The light-blocking metal pattern BML of the display panel 300 is disposed between the second barrier layer 311 and the TFT layer 320. An insulating interlayer 312 may be further disposed on the light-blocking metal pattern BML. The semiconductor layer ACT may be disposed on the insulating interlayer 312.

Referring to FIG. 8, the TFT layer 320 includes the semiconductor layer ACT shown in FIG. 6, a gate insulating film 321 disposed on the semiconductor layer ACT, a gate electrode GE of the TFTs T1 to T7 disposed on the gate insulating film 321, an insulating interlayer film 322 disposed on the gate electrode GE, and a source electrode SE and a drain electrode DE arranged on the insulating interlayer film 322.

The source electrode SE and the drain electrode DE may be electrically connected to a source region and a drain region of the semiconductor layer ACT through a contact hole, respectively.

The above-described gate electrode GE, source electrode SE, and drain electrode DE may form three terminals of a TFT among the TFTs T1 to T7.

A via layer VIA1 is disposed on the source electrode SE, the drain electrode DE, and the insulating interlayer film 322. The first via layer VIA1 is disposed to cover the TFT layer 320 including the TFTs T1 to T7. The via layer VIA1 may be a planarization film. The planarization film may include a material such as acryl and polyimide.

The LED layer 340 is disposed on the first via layer VIA1. The LED layer 340 may include a plurality of LEDs arranged for each pixel. The LED layer may include an anode electrode, a cathode electrode, and an organic emissive layer disposed between the anode electrode and the cathode electrode. A plurality of anode electrodes ANO are arranged on the first via layer VIA1. A given one of the anode electrodes ANO may be a pixel electrode for a corresponding one of the pixels.

The anode electrode ANO may be electrically connected to the drain electrode DE (or the source electrode SE) through a via hole passing through the first via layer VIA1.

The anode electrode ANO may include a material having a high work function. The anode electrode ANO may include a conductive material such as indium tin oxide (ITO), indium zinc oxide (IZO), zinc oxide (ZnO), or indium oxide ($In_2O_3$). The exemplified above conductive materials may have a relatively high work function and be transparent. When the OLED display device is a top emissive type device, in addition to the exemplified conductive materials, the anode electrode ANO may include a reflecting material such as Ag, Mg, Al, Pt, Pd, Au, Ni, Nd, Ir, Cr, lithium (Li), Ca, or a compound thereof. Accordingly, the anode electrode ANO may have a single-layer structure formed of the exemplified conductive material and reflecting material or a multilayer structure formed of a stack thereof.

A pixel definition film BNK is disposed on the anode electrode ANO. The pixel definition film BNK includes an opening portion which exposes at least part of the anode electrode ANO. The pixel definition film BNK may include an organic material or an inorganic material. In an exemplary embodiment, the pixel definition film BNK includes a material such as photoresist, a polyimide resin, an acrylic resin, a silicon compound, or a polyacrylic resin.

An organic emissive layer EL is disposed on a portion of the anode electrode ANO exposed by the pixel definition film BNK. The organic emissive layer EL may be a color light emitting layer which emits a particular color. For example, the organic emissive layer EL may include a red light emitting layer which emits a red light, a green light emitting layer which emits a green light, or a blue light emitting layer which emits a blue light. A color light emitting layer may be disposed for each pixel.

In an exemplary embodiment, the organic emissive layer EL is integrally formed unlike that shown in FIG. 8. That is, the organic emissive layer EL may be integrally formed without distinction between pixels. The organic emissive layer EL may include a color light emitting layer which emits one color. For example, the organic emissive layer EL may be a blue light emitting layer which emits a blue light. In this case, wavelength conversion patterns may be further arranged above the organic emissive layer EL in order to convert colors of light emitted from the organic emissive layer EL.

A cathode electrode CAT is disposed on the organic emissive layer EL. The cathode electrode CAT may be a common electrode disposed all over without distinction between pixels. The cathode electrode CAT may include a material having a low work function. The cathode electrode CAT may include Li, Ca, LiF/Ca, LiF/Al, Al, Mg, Ag, Pt, Pd, Ni, Au Nd, Ir, Cr, BaF, Ba, a compound or a mixture thereof (for example, a mixture of Ag and Mg). The cathode electrode CAT may further include an auxiliary electrode. The auxiliary electrode may include a film formed by depositing a transparent metal oxide such as ITO, IZO, ZnO, or ITZO.

When the display device 1 is a top emissive type device, a conductive layer having a low work function may be formed as a thin film and a transparent conductive film such as an ITO layer, an IZO layer, a ZnO layer, or an $In_2O_3$ layer may be stacked thereabove.

Although not shown, a hole injection layer and/or a hole transport layer may be disposed between the anode electrode ANO and the organic emissive layer EL and an electron transport layer and/or an electron injection layer may be disposed between the organic emissive layer EL and the cathode electrode CAT.

The encapsulation layer 360 is disposed on the LED layer 340. The encapsulation layer 360 includes at least one inorganic layer and at least one organic layer. The at least one inorganic layer and the at least one organic layer may be mutually stacked. For example, as shown in FIG. 8, the encapsulation layer 360 may be formed of a multilayer film including a first encapsulation inorganic layer 361, an encapsulation organic layer 362, and a second encapsulation inorganic layer 363, which are sequentially stacked. Here, the first encapsulation inorganic layer 361 and the second encapsulation inorganic layer 363 may include one or more selected from the group consisting of silicon oxide ($SiO_x$), silicone nitride ($SiN_x$), and silicon oxynitride ($SiON_x$), and the encapsulation organic layer 362 may include any one selected from the group consisting of epoxy, acrylate, and urethane acrylate.

Referring back to FIG. 7, in the first support substrate 302, a thickness of the sensor area SA is smaller than a thickness of the non-sensor area NSA. The first support substrate 302 includes a through hole passing therethrough from a surface thereof in the sensor area SA in a thickness direction. A plurality of such through holes may be present, but one through hole will be described for convenience of description.

The first barrier layer 303 includes a top surface facing the second support substrate 304 and a bottom surface 303a located on a surface opposite the top surface. The second support substrate 304 includes a bottom surface 304a facing the top surface of the first barrier layer 303 and a top surface located on a surface opposite the bottom surface 304a of the first barrier layer 303. The second barrier layer 311 located above the second support substrate 304 includes a bottom surface 311a facing the top surface of the second support substrate 304 and a top surface opposite the bottom surface 311a of the second barrier layer 311.

The through hole of the first support substrate 302 may cross from the surface of the first support substrate 302 in a thickness direction and may completely cross the first support substrate 302. Due to this, the bottom surface of the first barrier layer 303 located on the first support substrate 302 may be exposed. For example, a portion of the first support substrate 302 in the sensor area SA may be removed so that the bottom surface of the first barrier layer 303 is exposed.

The through hole in the sensor area SA of the first support substrate 302 may be formed using a laser. The laser may be an ultraviolet laser within an ultraviolet laser wavelength range but is not limited thereto. When the through hole of the first support substrate 302 is formed using the ultraviolet laser, a burr may be formed in the non-sensor area NSA adjacent to the sensor area SA of the first support substrate 302 due to heat energy generated by the ultraviolet laser at an adjacent part. The burr of the first support substrate 302 may protrude from the surface of the first support substrate 302. For example, the burr may be a bump or a protrusion.

As described above, when polyimide is applied to the first support substrate 302, the polyimide is seen as yellow with the naked eye. Here, the optical sensor 710 emits light within a range of a visible ray wavelength or an ultraviolet or infrared wavelength close to the visible ray wavelength or absorbs light within a blue wavelength range when the light reflected by the object is within such a wavelength range. This may cause degradation in a function of the optical sensor 710.

Also, due to the substrate portion 301 of the display panel 300, a desired quantity of the sensor light SL emitted from the optical sensor 710 may not reach the object or at least the part of the sensor light SL reflected by the object may not be incident on the light receiving portion 730.

However, in the display panel 300 according to an exemplary embodiment of the inventive concept, the through hole, which crosses the first support substrate 302 from the surface of the first support substrate 302 in the thickness direction in the sensor area SA in which the optical sensor 710 is disposed, is disposed such that it is possible to prevent a function of the optical sensor 710 from being degraded due to the material of the first support substrate 302 or to prevent a desired quantity of the sensor light SL emitted from the optical sensor 710 from failing to reach the object or to prevent at least a part of the sensor light SL reflected by the object from failing to be incident on the light receiving portion 730. That is, the quantity of the emitted sensor light SL and the quantity of the incident sensor light SL are provided not only to increase definition of an acquired image but also to provide a more efficient function of the optical sensor 710.

Hereinafter, a display device according to an exemplary embodiment of the inventive concept will be described. In a following embodiment, components the same as those of the above-described embodiment will be referred to with the same reference numerals and a description thereon will be omitted or simplified.

Figure 9:
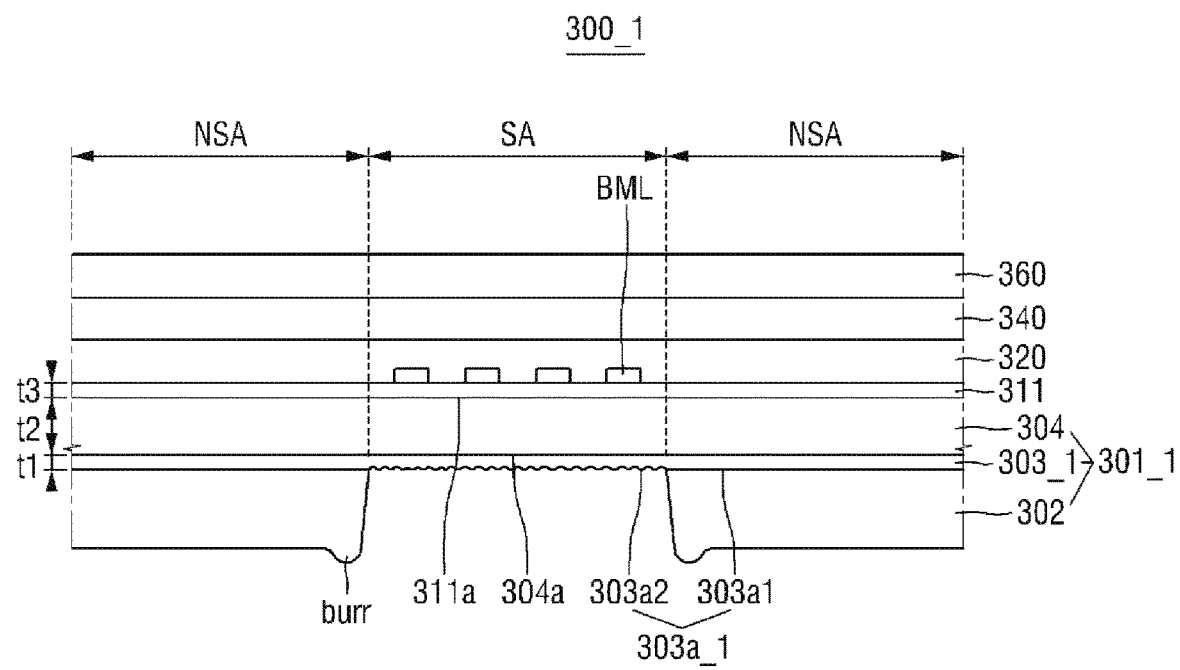
FIG. 9 is a cross-sectional view of a display panel according to an exemplary embodiment of the disclosure.

FIG. 9 is a cross-sectional view of a display panel according to an exemplary embodiment of the inventive concept.

Referring to FIG. 9, a display panel 300_1 according to the embodiment is different from the display panel 300 according to an embodiment, in that a bottom surface 303a_1 of a first barrier layer 303_1 of a substrate portion 301_1 includes a first part 303a1 having a first coarseness level and a second part 303a2 having a second coarseness level greater than the first coarseness level.

In the display panel 300_1 according to the embodiment, the bottom surface 303a_1 of the first barrier layer 303_1 of the substrate portion 301_1 includes the first part 303a1 having the first coarseness level and the second part 303a2 having the second coarseness level greater than the first coarseness level.

The first part 303a1 is disposed in the non-sensor area NSA and is overlapped with the first support substrate 302 therebelow, and the second part 303a2 is disposed in the sensor area SA. The second part 303a2 may be disposed to be overlapped with the through hole. For example, the second part 303a2 is exposed while the first part 303a1 is covered by the first support substrate 302. In an exemplary embodiment, a thickness of the second part 303a2 is the same as a thickness of the first part 303a.

The second part 303a2 may include a carbonized surface. Since a carbonized surface may occur on a surface of the second part 303a2 due to laser emitted by an ultraviolet laser device when the through hole is formed using the ultraviolet laser device as described above, the second part 303a2 has a coarseness level higher than that of the first part 303a1.

In the display panel 300_1 according to the embodiment, the through hole, which crosses the first support substrate 302 from the surface of the first support substrate 302 in the thickness direction in the sensor area SA in which the optical sensor 710 is disposed, is disposed such that it is possible to prevent a function of the optical sensor 710 from being degraded due to the material of the first support substrate 302 or to prevent a desired quantity of the sensor light SL emitted from the optical sensor 710 from failing to reach the object or to prevent at least part of the sensor light SL reflected by the object from failing to be incident on the light receiving portion 730. That is, the quantity of the emitted sensor light SL and the quantity of the incident sensor light SL are provided not only to increase definition of an acquired image but also to provide a more efficient function of the optical sensor 710.

Figure 10:
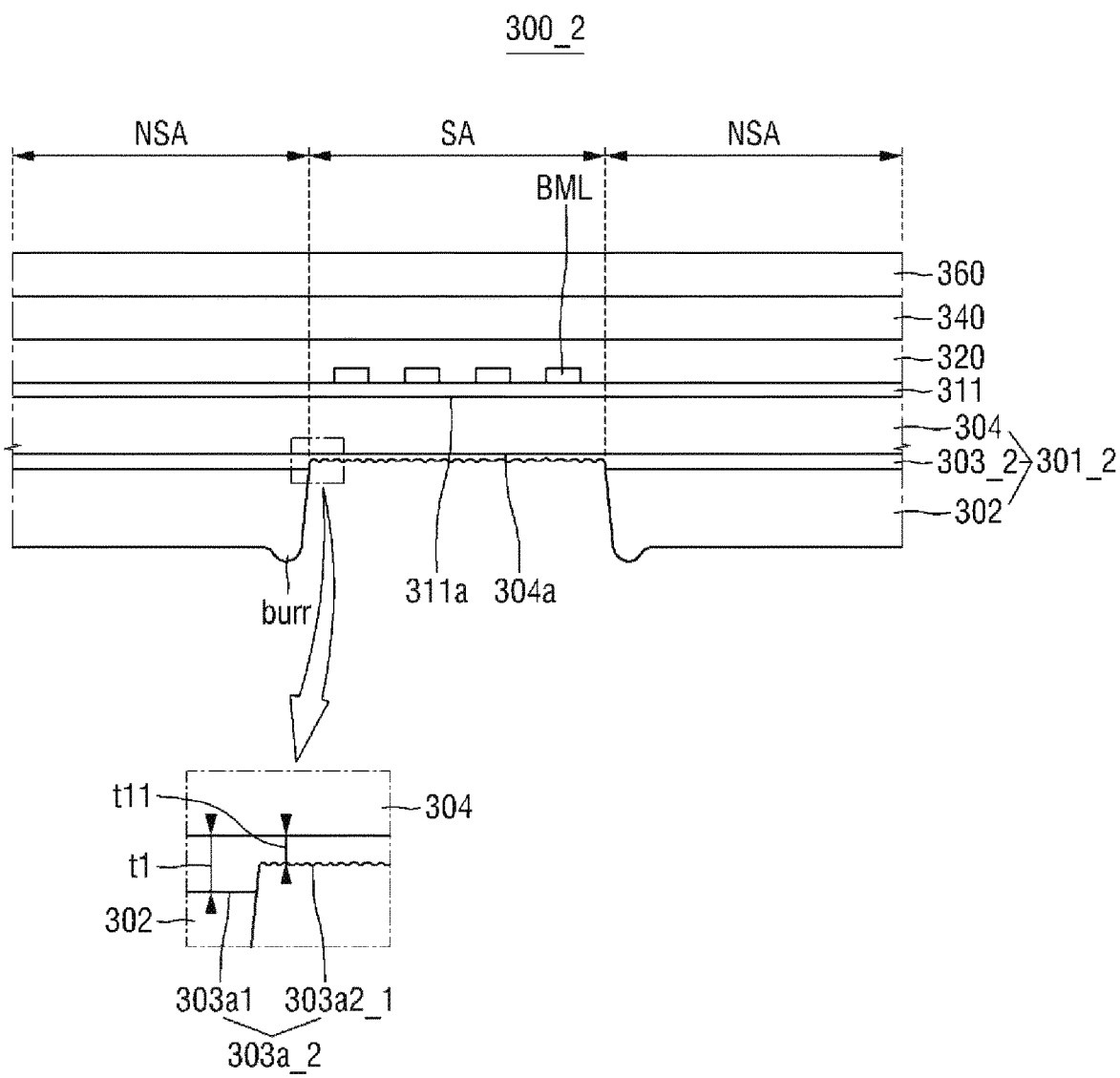
FIG. 10 is a cross-sectional view of a display panel according to an exemplary embodiment of the disclosure.

FIG. 10 is a cross-sectional view of a display panel according to an exemplary embodiment of the inventive concept.

Referring to FIG. 10, a display panel 300_2 according to the embodiment is different from the display panel 300_1 of FIG. 9, in that a first barrier layer 303_2 of a substrate portion 301_2 has different thicknesses in the sensor area SA and the non-sensor area NSA.

The through hole may be formed to further pass through into an interior of the first barrier layer 303_2. In an exemplary embodiment, a second part 303a2_1 of a bottom surface 303a_2 of the first barrier layer 303_2 is located closer to the second support substrate 304 than the first part 303a1. That is, the second part 303a2_1 may penetrate further upward.

In an exemplary embodiment, the first barrier layer 303_2 has a thickness smaller in the sensor area SA than the non-sensor area NSA. For example, the first barrier layer 303_2 may be thinner in the sensor area SA and thicker in the non-sensor area NSA. That is, an 11th thickness t11 of the first barrier layer 303_2 in the sensor area SA is smaller than a first thickness t1 in the non-sensor area NSA.

Figure 11:
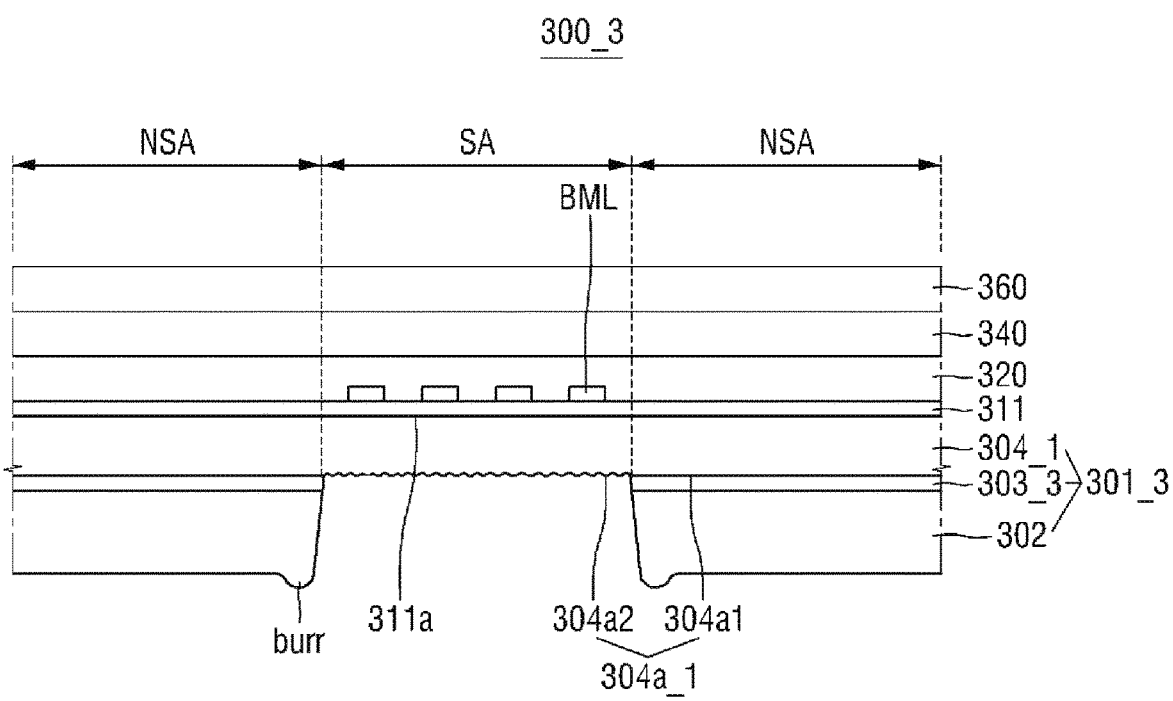
FIG. 11 is a cross-sectional view of a display panel according to an exemplary embodiment of the disclosure.

FIG. 11 is a cross-sectional view of a display panel according to an exemplary embodiment of the inventive concept.

Referring to FIG. 11, a display panel 300_3 according to the embodiment is different from the display panel 300_2 of FIG. 10 in that the through hole of a substrate portion 301_3 completely crosses a first barrier layer 303_3 and a bottom surface 304a_1 of a second support substrate 304_1 is exposed.

In the display panel 300_3 according to the embodiment, the through hole of the substrate portion 301_3 may completely cross the first barrier layer 303_3 such that the bottom surface 304a_1 of the second support substrate 304_1 may be exposed. For example, a portion of the first support substrate 302 and a portion of the first barrier layer 303_3 in the sensor area SA may be removed to expose the second support substrate 304_1.

The bottom surface 304a_1 of the second support substrate 304_1 includes a first part 304a1 and a second part 304a2 having a coarseness level higher than that of the first part 304a1.

The first part 304a1 is disposed in the non-sensor area NSA and is overlapped with the first support substrate 302 therebelow, and the second part 304a2 is disposed in the sensor area SA. The second part 304a2 may be disposed to be overlapped with the through hole.

Figure 12:
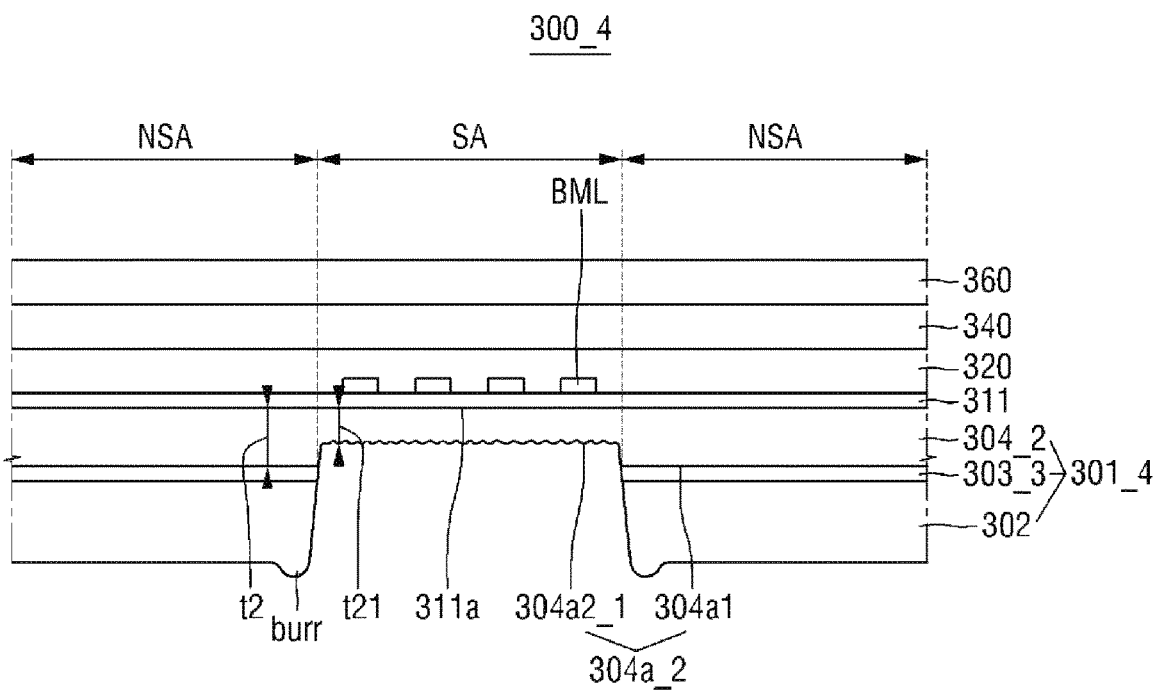
FIG. 12 is a cross-sectional view of a display panel according to an exemplary embodiment of the disclosure.

FIG. 12 is a cross-sectional view of a display panel according to an exemplary embodiment of the inventive concept.

Referring to FIG. 12, a display panel 300_4 according to the embodiment is different from the display panel 300_3 of FIG. 11 in that a second support substrate 304_2 of a substrate portion 301_4 has different thicknesses in the sensor area SA and the non-sensor area NSA.

The through hole may be formed to further pass through into an interior of the second support substrate 304_2. A second part 304a2_1 of a bottom surface 304a_2 of the second support substrate 304_2 may be located to be closer to the second barrier layer 311 than the first part 304a1. That is, the second part 304a2_1 may penetrate further upward.

The second support substrate 304_2 may have a thickness smaller in the sensor area SA than the non-sensor area NSA. For example, the second support substrate 304_2 may be thinner in the sensor area SA and thicker in the non-sensor area NSA. That is, a 21st thickness t21 of the second support substrate 304_2 in the sensor area SA is smaller than a second thickness t2 thereof in the non-sensor area NSA.

Figure 13:
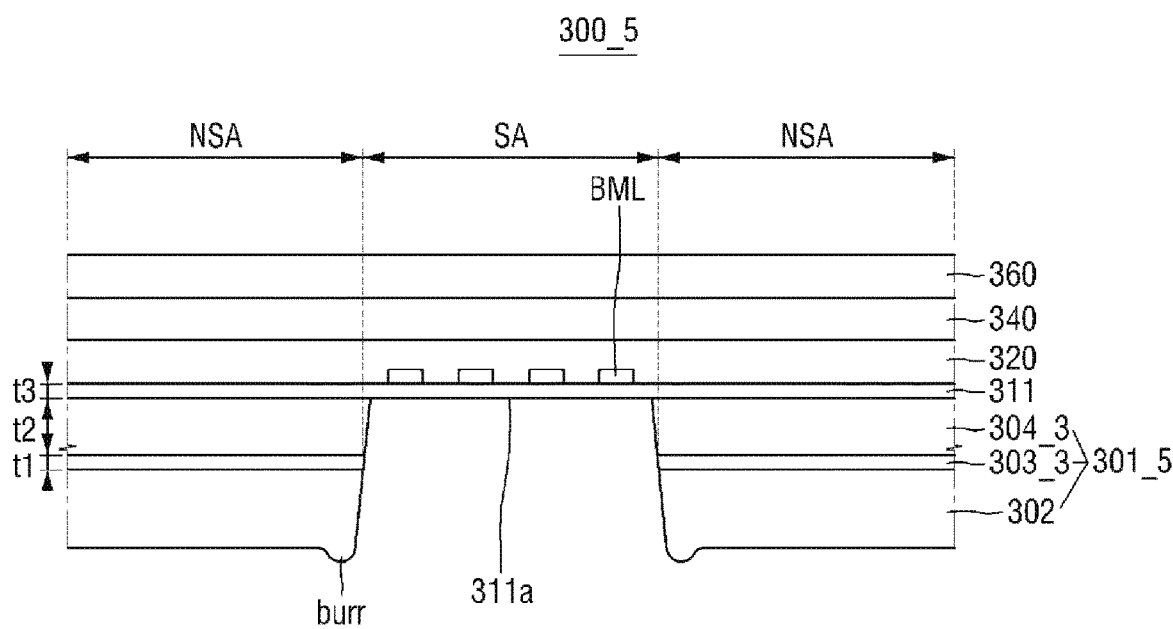
FIG. 13 is a cross-sectional view of a display panel according to an exemplary embodiment of the disclosure.

FIG. 13 is a cross-sectional view of a display panel according to an exemplary embodiment of the inventive concept.

Referring to FIG. 13, a display panel 300_5 according to the embodiment is different from the display panel 300_4 of FIG. 12 in that the through hole of a substrate portion 301_5 completely crosses a second support substrate 304_3 and the bottom surface 311a of the second barrier layer 311 is exposed.

In the display panel 300_5 according to the embodiment, the through hole of the substrate portion 301_5 may completely cross the second support substrate 304_3 such that the bottom surface 311a of the second barrier layer 311 may be exposed. For example, portions of the first support substrate 302, the first barrier layer 303_3, and the second support substrate 304_3 in the sensor area SA may be removed to expose the second barrier layer 311.

Figure 14:
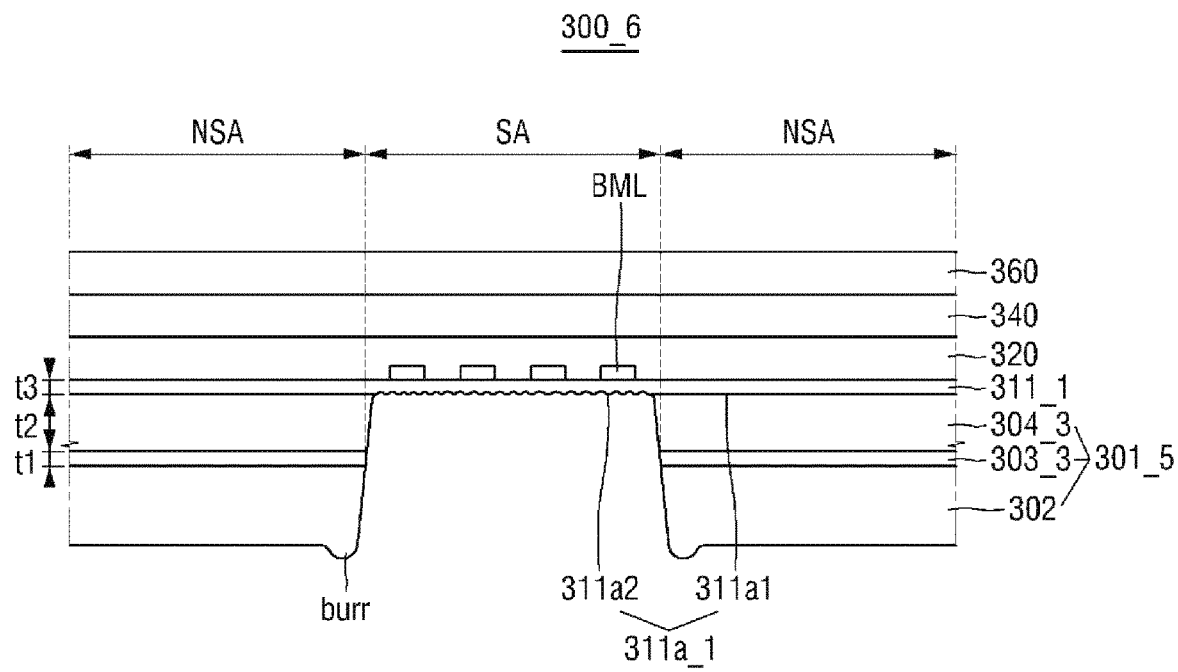
FIG. 14 is a cross-sectional view of a display panel according to an exemplary embodiment of the disclosure.

FIG. 14 is a cross-sectional view of a display panel according to an exemplary embodiment of the inventive concept.

Referring to FIG. 14, in a display panel 300_6 according to the embodiment, a bottom surface 311a_1 of a second barrier layer 311_1 includes a first part 311a1 and a second part 311a2 having a coarseness level higher than that of the first part 311a1.

The first part 311a1 is disposed in the non-sensor area NSA and is overlapped with the first support substrate 302 therebelow, and the second part 311a2 is disposed in the sensor area SA. The second part 311a2 may be disposed to be overlapped with the through hole. The display panel 300_6 of FIG. 14 is similar to the display panel 300_5 of FIG. 13, but the exposed bottom surface of the second barrier layer 311_1 is coarser than the exposed bottom surface of the second barrier layer 311. In an exemplary embodiment, a thickness of the second part 311a2 is the same as the thickness of the first part 311a1.

Figure 15:
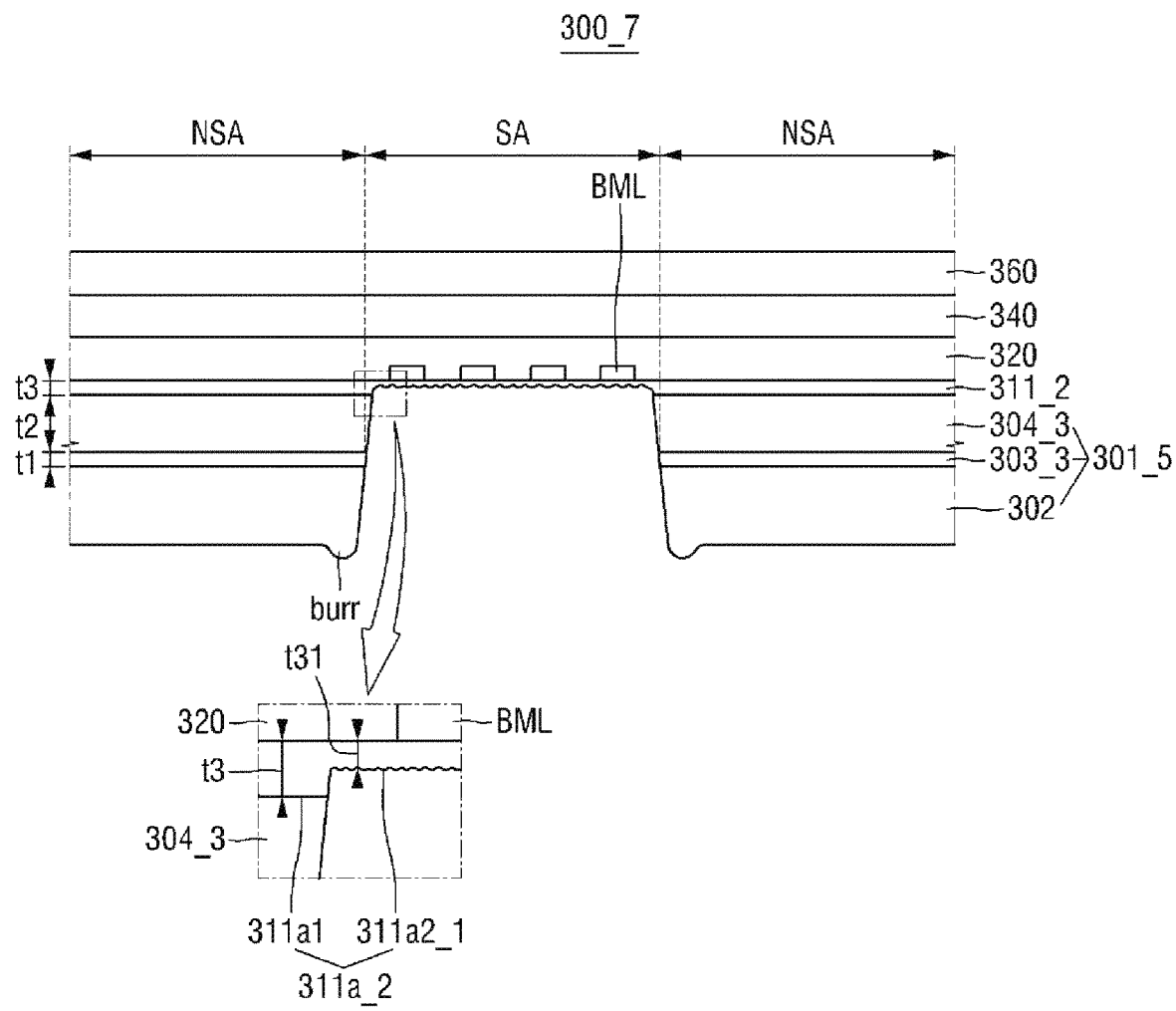
FIG. 15 is a cross-sectional view of a display panel according to an exemplary embodiment of the disclosure.

FIG. 15 is a cross-sectional view of a display panel according to an exemplary embodiment of the inventive concept.

Referring to FIG. 15, a display panel 300_7 according to the embodiment is different from the display panel 300_6 of FIG. 14 in that a second barrier layer 311_2 has different thicknesses in the sensor area SA and the non-sensor area NSA.

The through hole may be formed to further pass through into an interior of the second barrier layer 311_2. A second part 311a2_1 of a bottom surface 311a_2 of the second barrier layer 311_2 may be located to be closer to the TFT layer 320 than the first part 311a1. That is, the second part 311a2_1 may penetrate further upward.

The second barrier layer 311_2 may have a thickness smaller in the sensor area SA than the non-sensor area NSA. For example, the second barrier layer 311_2 may be thinner in the sensor area SA and thicker in the non-sensor area NSA. That is, a 31st thickness t31 of the second barrier layer 311_2 in the sensor area SA is smaller than a third thickness t3 in the non-sensor area NSA.

Figure 16:
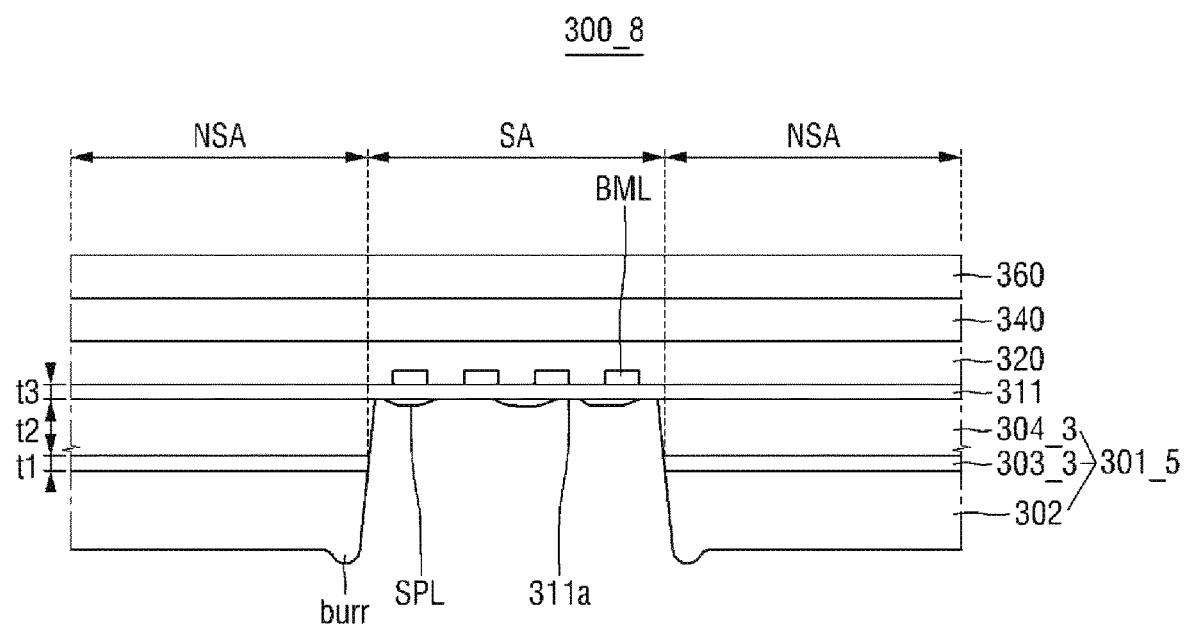
FIG. 16 is a cross-sectional view of a display panel according to an exemplary embodiment of the disclosure.

FIG. 16 is a cross-sectional view of a display panel according to an exemplary embodiment of the inventive concept.

Referring to FIG. 16, a display panel 300_8 according to the embodiment is different from the display panel 300_5 of FIG. 13 in that a sacrificial layer residual SPL is disposed on the bottom surface 311a of the second barrier layer 311. In FIG. 16, it is shown that a sacrificial layer remains as a residue after a process of forming the through hole.

In a display panel 300_8 according to the embodiment, the sacrificial layer residual SPL is disposed on the bottom surface 311a of the second barrier layer 311.

The sacrificial layer may be disposed between the second support substrate 304_3 and the second barrier layer 311 during the process of forming the through hole not only to prevent the light-blocking metal pattern BML and the TFT layer 320 formed thereabove from being damaged by the ultraviolet laser but also to allow materials included in the second support substrate 304_3, materials included in the first barrier layer 303_3, and materials included in the first support substrate 302, which are incised by the ultraviolet laser, to be easily removed from the bottom surface 311a of the second barrier layer 311.

The sacrificial layer residual SPL is shown as being disposed on only the bottom surface 311a of the second barrier layer 311 in FIG. 16 but may be disposed on the bottom surface 303a of the first barrier layer 303 in the embodiment of FIG. 7. In an exemplary embodiment, the sacrificial layer residual SPL includes a plurality of layers or regions that are spaced apart from one another in the sensor area SA.

Figure 17:
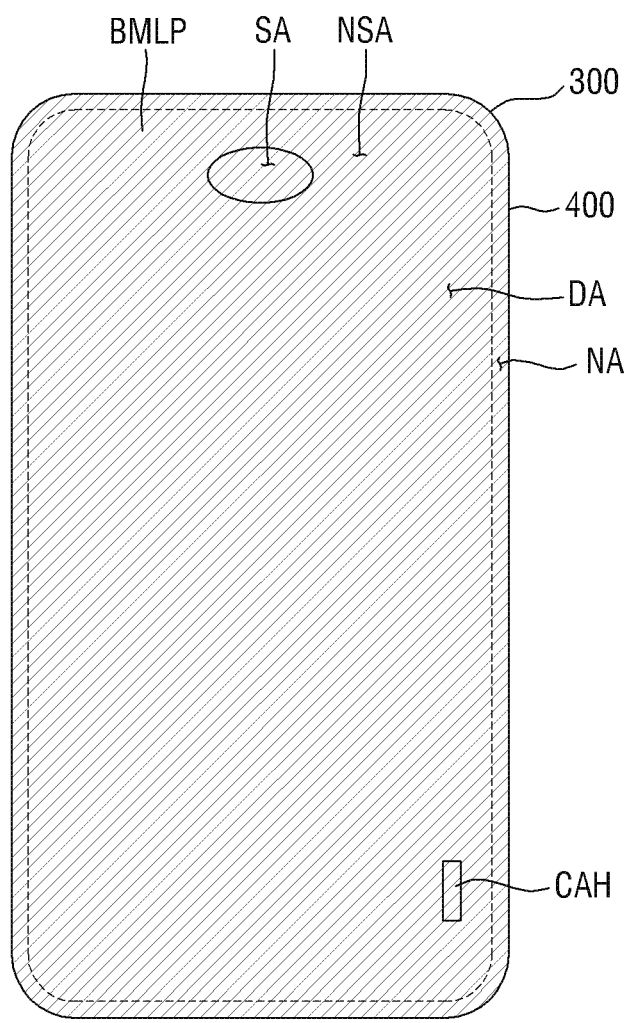
FIG. 17 is a schematic plan view illustrating a lower panel sheet and a display panel according to an exemplary embodiment of the disclosure.

FIG. 17 is a schematic plan view illustrating a lower panel sheet and a display panel according to an exemplary embodiment of the inventive concept.

Referring to FIG. 17, a display device 2 according to the embodiment is different from the display device 1 of FIG. 4 in that the light-blocking metal pattern disposition area BMLP is disposed to extend over an entire surface of the display panel 300. That is, the light-blocking metal pattern BML disposed in the light-blocking metal pattern disposition area BMLP is disposed over the entire surface of the display panel 300. For example, the light-blocking metal pattern BML may entirely overlap the display area DA and the non-display area NA.

Figure 18:
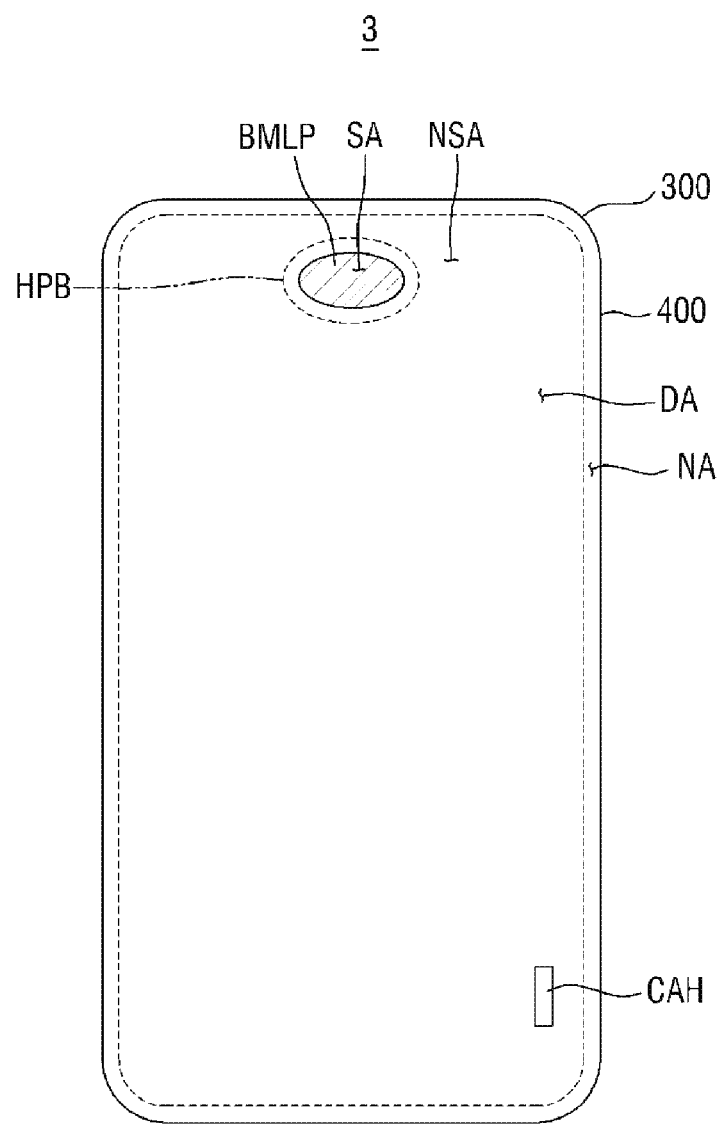
FIG. 18 is a schematic plan view of a lower panel sheet and a display panel according to an exemplary embodiment of the disclosure.
Figure 19:
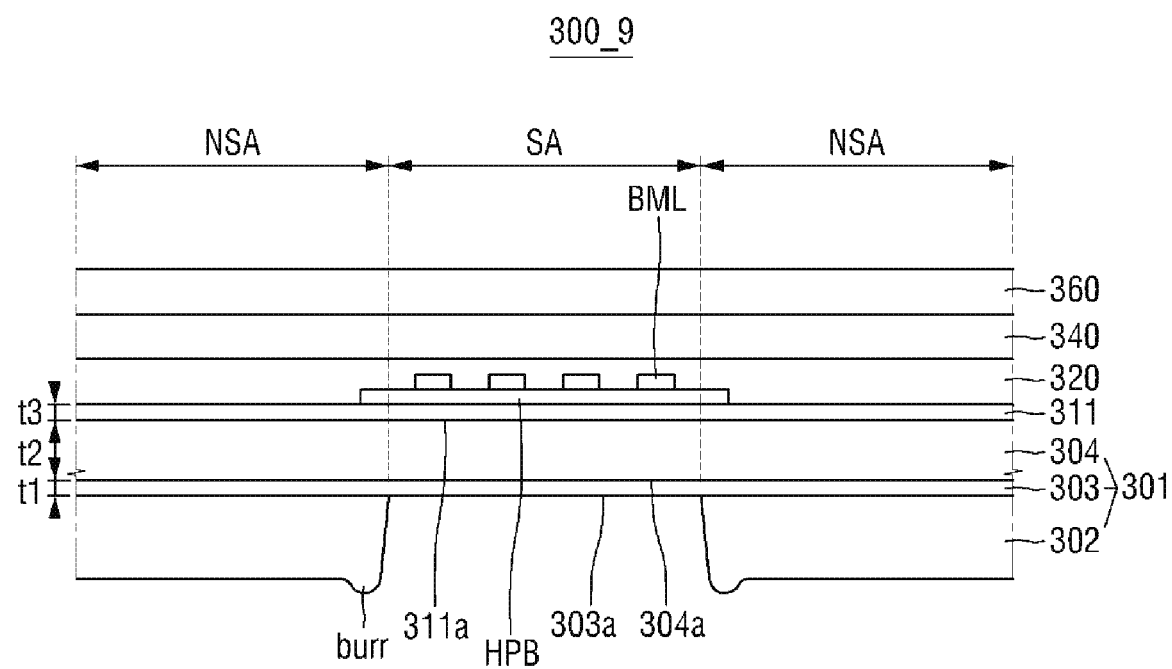
FIG. 19 is a cross-sectional view of the display panel of FIG. 18 according to an exemplary embodiment of the disclosure.

FIG. 18 is a schematic plan view illustrating a lower panel sheet and a display panel according to an exemplary embodiment of the inventive concept, and FIG. 19 is a cross-sectional view of the display panel of FIG. 18 according to an exemplary embodiment of the inventive concept.

Referring to FIGS. 18 and 19, a display panel 300_9 of a display device 3 according to the embodiment is different from the display panel 300 of the display device 1 according to an embodiment in that a humidity penetration blocking pattern HPB overlapped with the sensor area SA is further disposed.

In the display panel 300_9 of the display device 3 according to the embodiment, the humidity penetration blocking pattern HPB overlapped with the sensor area SA is further disposed.

In an exemplary embodiment, the humidity penetration blocking pattern HPB has an area greater than an area of the sensor area SA in a plane. That is, the humidity penetration blocking pattern HPB may be disposed to extend to the sensor area SA and to a part of the non-sensor area NSA adjacent thereto. For example, the humidity penetration blocking pattern HPB may entirely surround the sensor area SA and extend further into only a part of the non-sensor area NSA.

The humidity penetration blocking pattern HPB may be disposed on a top surface of the second barrier layer 311. In an exemplary embodiment, the humidity penetration blocking pattern HPB is disposed between the second barrier layer 311 and the light-blocking metal pattern BML. For example, the humidity penetration blocking pattern HPB may directly contact the second barrier layer 311.

In an embodiment, the humidity penetration blocking pattern HPB includes silicon oxynitride ($SiO_xN_y$). The humidity penetration blocking pattern HPB preferably has a small difference in a refractive index when $SiO_x$ or $SiN_x$ is applied to the second barrier layer 311 disposed therebelow. Here, the humidity penetration blocking pattern HPB according to the embodiment includes $SiO_xN_y$ so as to not only reduce a refractive difference from the second barrier layer 311 disposed therebelow but also to prevent humidity or moisture from flowing in through the through hole.

Figure 20:
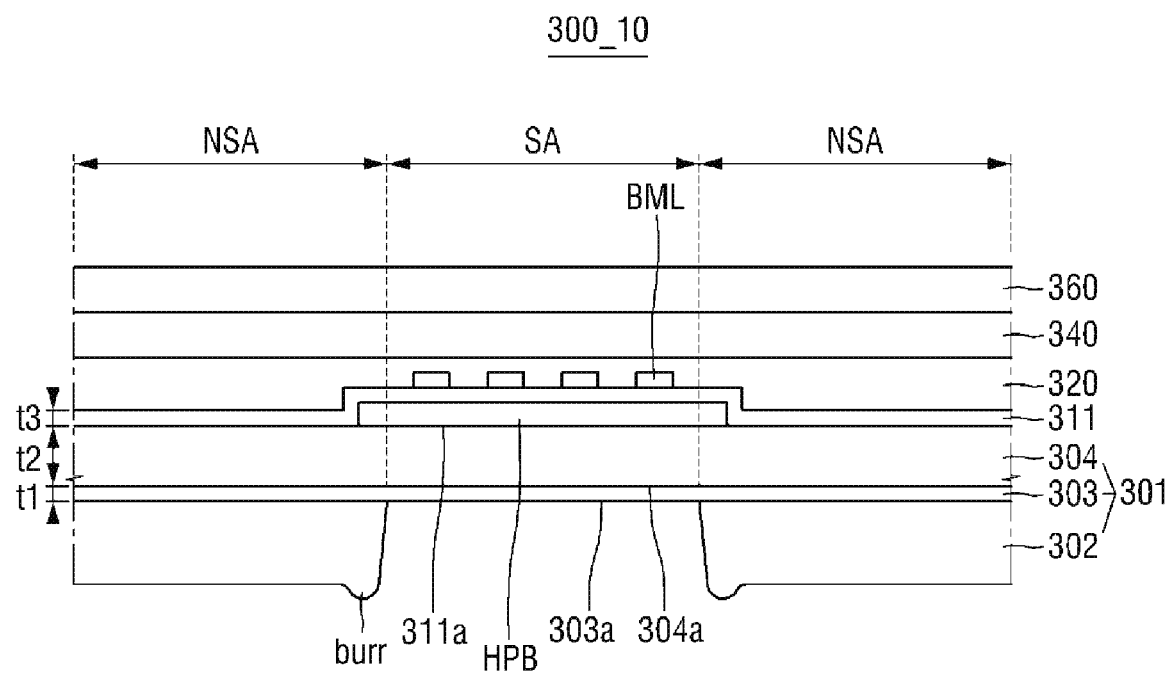
FIG. 20 is a cross-sectional view of a display panel according to an exemplary embodiment of the disclosure.

FIG. 20 is a cross-sectional view of a display panel according to an exemplary embodiment of the inventive concept.

Referring to FIG. 20, a display panel 300_10 according to the embodiment is different from the display panel 300_9 of FIG. 20 in that the humidity penetration blocking pattern HPB is disposed between the second barrier layer 311 and the second support substrate 304.

In the display panel 300_10, the humidity penetration blocking pattern HPB is disposed between the second barrier layer 311 and the second support substrate 304. The humidity penetration blocking pattern HPB may be disposed directly on a top surface of the second support substrate 304. Other descriptions have been set forth above with reference to FIGS. 18 and 19, and therefore repetitive descriptions will be omitted. In an exemplary embodiment, an upper surface of the second barrier layer 311 in the sensor area SA is closer to the bottom surface of the LED layer 340 than first portions of the upper surface of the second barrier layer 311 in the non-sensor area NSA. Second other portions of the upper surface of the second barrier layer 311 in the non-sensor area NSA between the first portions and the upper surface of the second barrier layer 311 in the sensor area SA may be a same distance away from the bottom surface of the LED layer 340 as the upper surface of the second barrier layer 311 in the sensor area SA.

Figure 21:
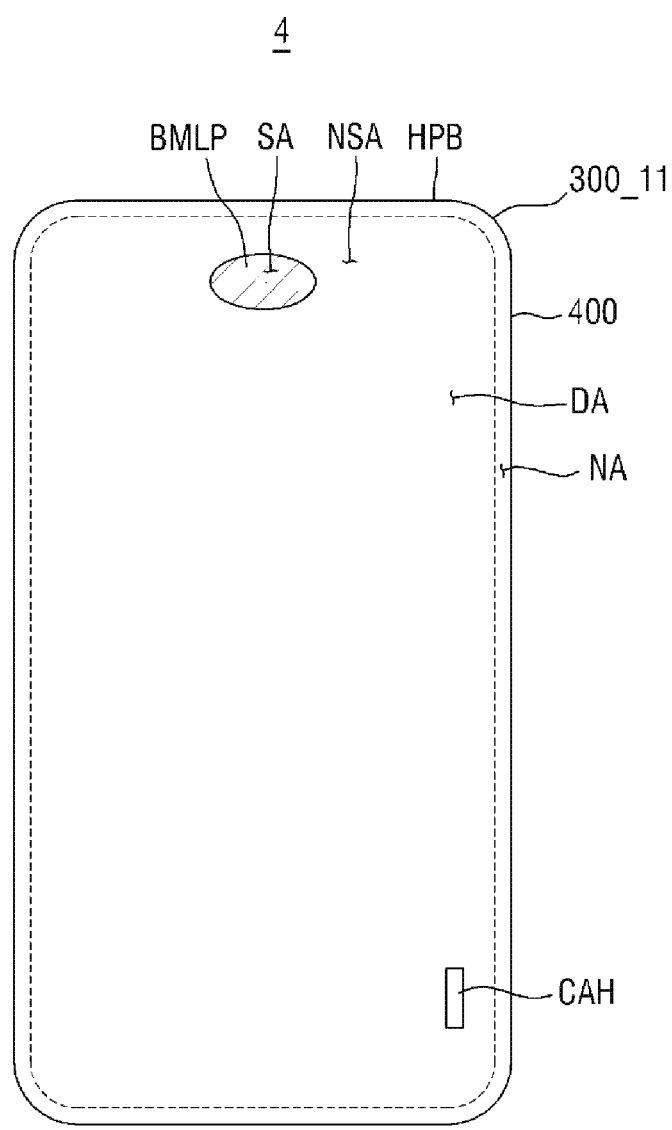
FIG. 21 is a schematic plan view illustrating a lower panel sheet and a display panel according to an exemplary embodiment of the disclosure.
Figure 22:
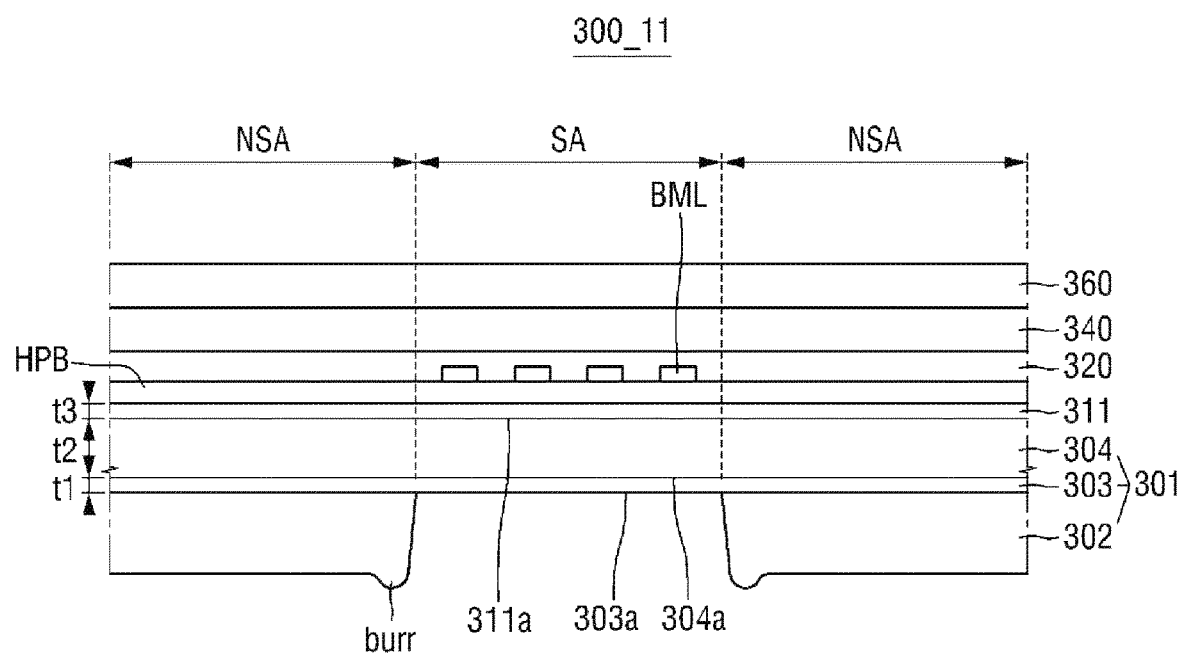
FIG. 22 is a cross-sectional view of the display panel of FIG. 21 according to an exemplary embodiment of the disclosure.

FIG. 21 is a schematic plan view illustrating a lower panel sheet and a display panel according to an exemplary embodiment of the inventive concept, and FIG. 22 is a cross-sectional view of the display panel of FIG. 21 according to an exemplary embodiment of the inventive concept.

Referring to FIGS. 21 and 22, a display panel 300_11 of a display device 4 according to the embodiment is different from the embodiment of FIGS. 18 and 19, in that the humidity penetration blocking pattern HPB is disposed over an entire surface of the display panel 300_11 in a plane. For example, the humidity penetration blocking pattern HPB may entirely overlap the display area DA and the non-display area NA.

Other descriptions have been set forth above with reference to FIGS. 18 and 19, and therefore repetitive descriptions will be omitted.

Figure 23:
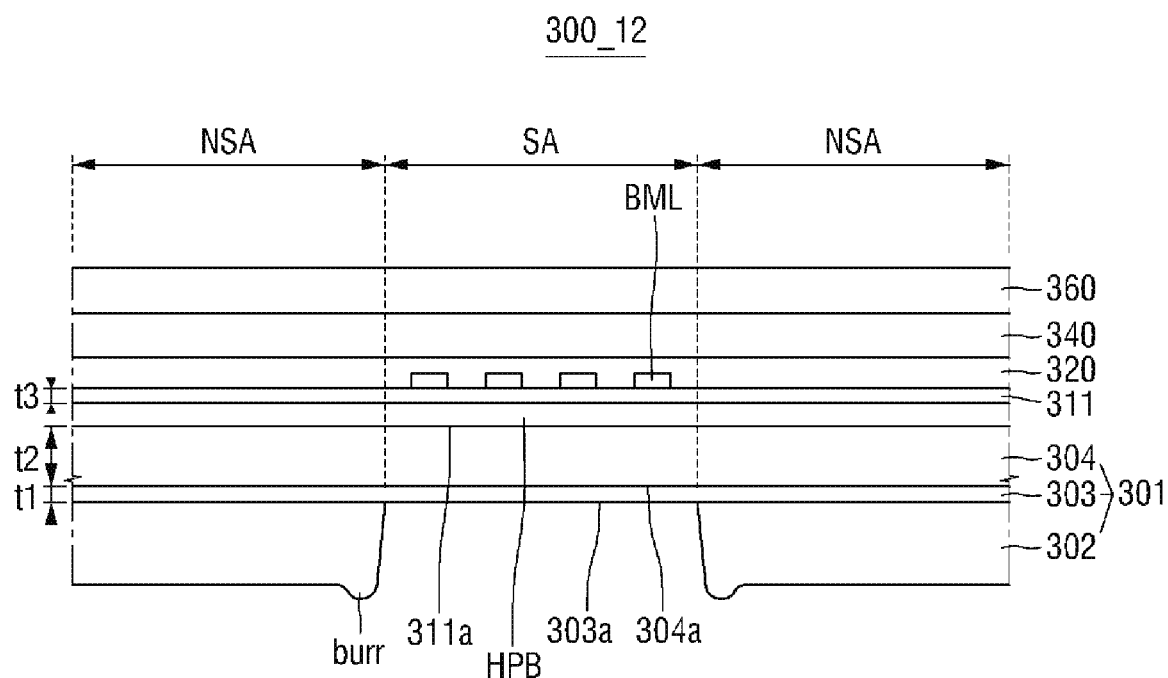
FIG. 23 is a cross-sectional view of a display panel according to an exemplary embodiment of the disclosure.

FIG. 23 is a cross-sectional view of a display panel according to an exemplary embodiment of the inventive concept.

Referring to FIG. 23, a display panel 300_12 according to the embodiment is different from the display panel 300_11 of FIG. 22 in that the humidity penetration blocking pattern HPB is disposed between the second barrier layer 311 and the second support substrate 304. For example, the humidity penetration blocking pattern HPB may entirely overlap the display panel 300_12 in a plan view and be disposed between the second barrier layer 311 and the second support substrate 304.

Other descriptions have been set forth above with reference FIGS. 21 and 22, and therefore repetitive descriptions will be omitted.

Figure 24:
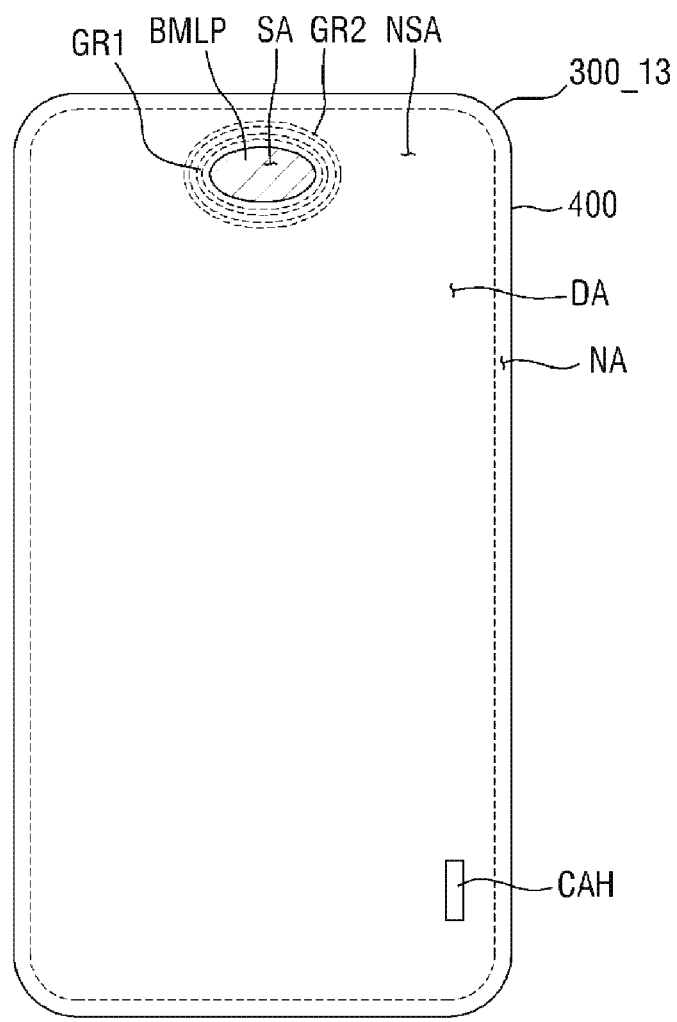
FIG. 24 is a schematic plan view illustrating a lower panel sheet and a display panel according to an exemplary embodiment of the disclosure.
Figure 25:
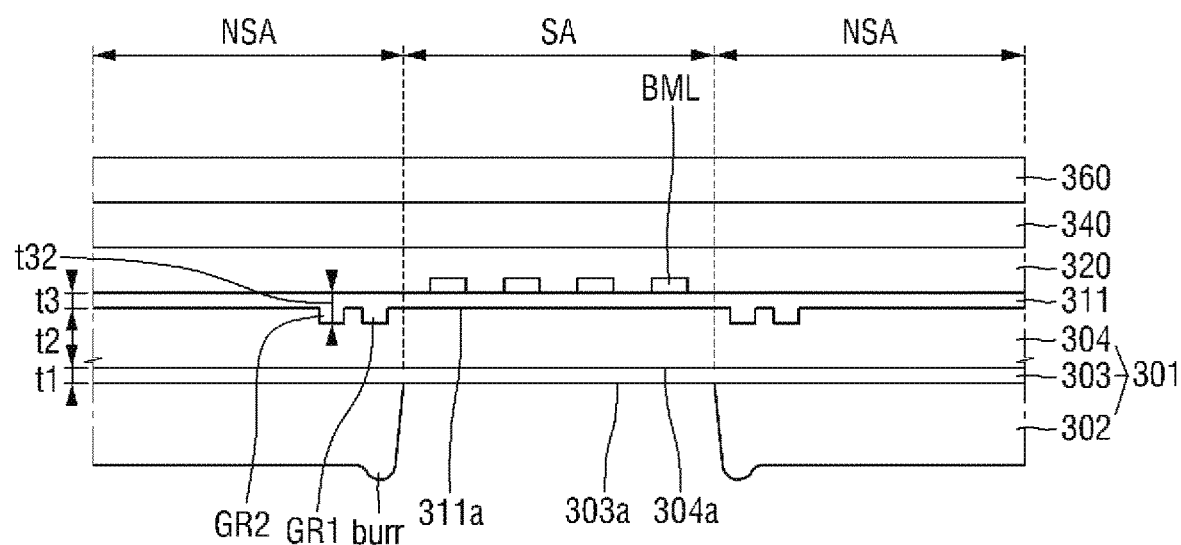
FIG. 25 is a cross-sectional view of the display panel of FIG. 24 according to an exemplary embodiment of the disclosure.

FIG. 24 is a schematic plan view illustrating a lower panel sheet and a display panel according to an exemplary embodiment of the inventive concept, and FIG. 25 is a cross-sectional view of the display panel of FIG. 24 according to an exemplary embodiment of the inventive concept.

Referring to FIGS. 24 and 25, a display panel 300_13 of a display device 5 according to the embodiment is different from the display panel of FIGS. 4 and 7 in that groove patterns GR1 and GR2, which surround the sensor area SA outside the sensor area SA in a plane, are further included.

The display panel 300_13 of the display device 5 according to the embodiment further includes a groove pattern which surrounds the sensor area SA outside the sensor area SA in a plane.

A plurality of such groove patterns may be included. Although the two groove patterns GR1 and GR2, which surround the sensor area SA outside the sensor area SA, are shown in FIG. 24, the number of groove patterns is not limited thereto and may be one or three or more.

In a plane, the first groove pattern GR1 may be surrounded by the second groove pattern GR2. The first groove pattern GR1 may surround the sensor area SA.

In a plane, the groove patterns GR1 and GR2 may have a looped curve shape which completely surrounds the sensor area SA. For example, at least one of the groove patterns GR1 and GR2 may have a circular or elliptical shape. In an exemplary embodiment, the groove patterns GR1 and GR2 have an opened curve shape in a plane, which does not completely surround the sensor area SA and is partially opened. In an exemplary embodiment, the opened curve shape is arc shaped.

As shown in FIG. 25, the groove patterns GR1 and GR2 may have a protruding shape downward from the second barrier layer 311. The second barrier layer 311, in which the groove patterns GR1 and GR2 are arranged, may have a 32nd thickness t32. In an exemplary embodiment, the 32nd thickness t32 is greater than the third thickness t3.

The groove patterns GR1 and GR2 may be physically connected to the second barrier layer 311. That is, the groove patterns GR1 and GR2 may include the same material as that of the second barrier layer 311. The groove patterns GR1 and GR2 may mate with corresponding recesses within the second support substrate 304. The recesses may be spaced apart from one another in the non-display area NSA.

The display panel 300_13 according to the embodiment may further include the groove patterns GR1 and GR2, which are physically connected to the second barrier layer 311 and protrude downward so as to prevent humidity or moisture from flowing in through the through hole.

Figure 26:
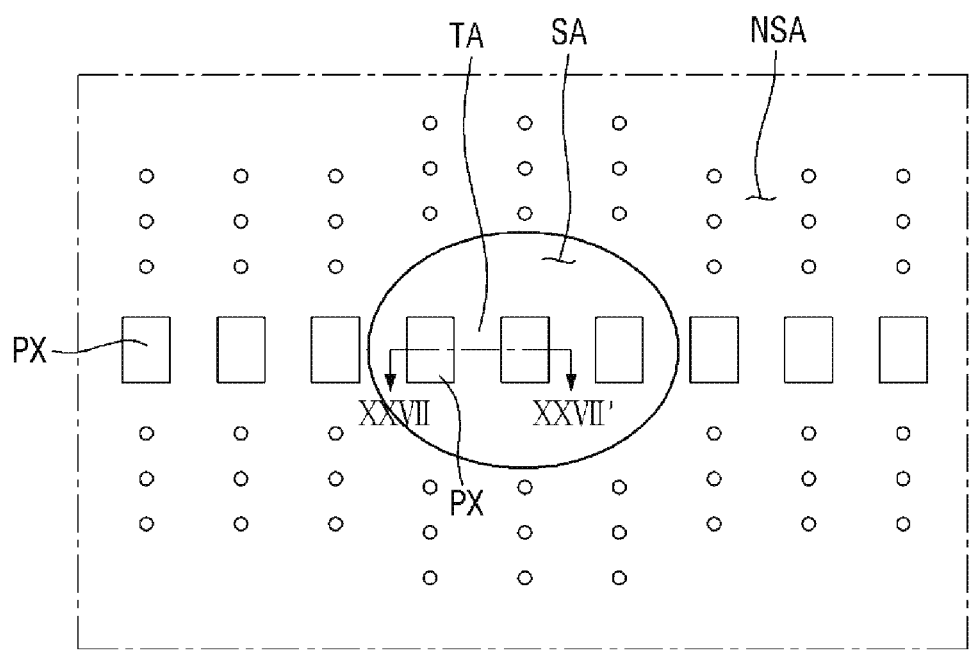
FIG. 26 is a plan view illustrating a plurality of pixels arranged in a sensor area and a non-sensor area.
Figure 27:
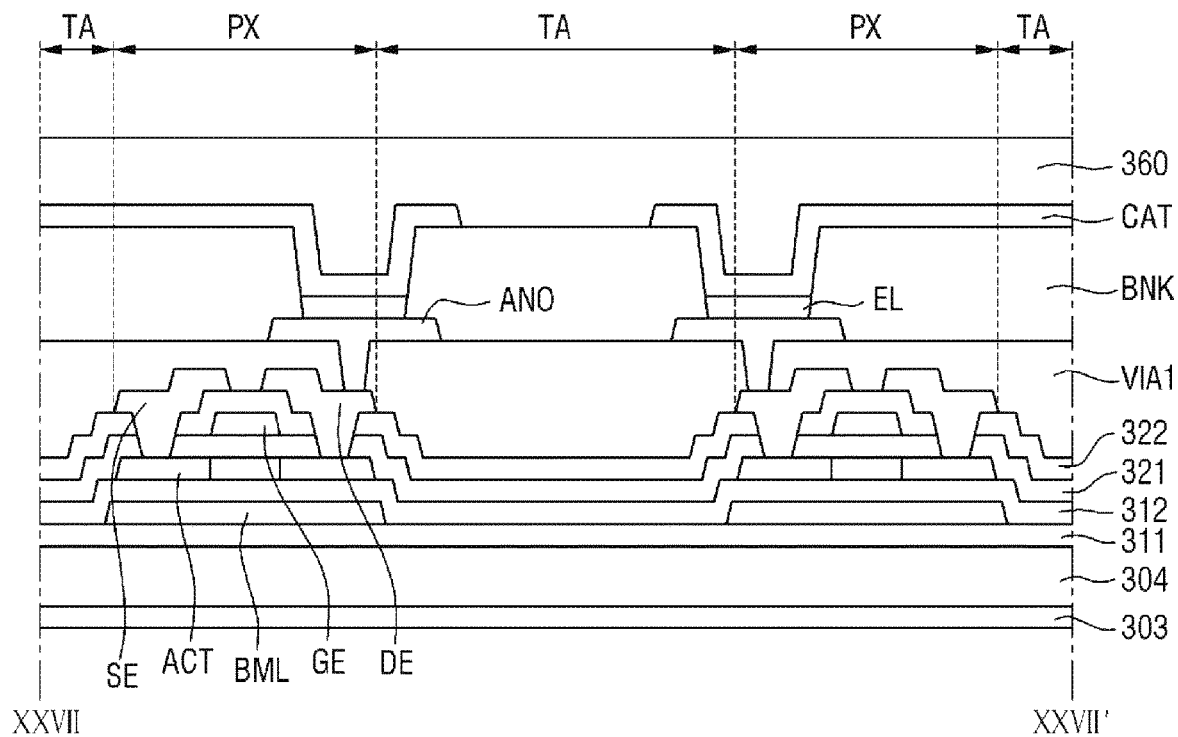
FIG. 27 is a cross-sectional view taken along line XXVII-XXVII' in FIG. 26.

FIG. 26 is a plan view illustrating a plurality of pixels arranged in the sensor area SA and the non-sensor area NSA, and FIG. 27 is a cross-sectional view taken along line XXVII-XXVII' in FIG. 26.

Referring to FIGS. 26 and 27, a plurality of pixels PX (like the pixel 10 of FIG. 5) are arranged at different densities in the sensor area SA and the non-sensor area NSA, which is different from the embodiment of FIGS. 4 and 8.

As shown in FIG. 26, a plurality of such pixels PX may be arranged in each of the sensor area SA and the non-sensor area NSA. In an exemplary embodiment, the density of the pixels PX arranged in the sensor area SA is smaller than the density of the pixels PX arranged in the non-sensor area NSA. The sensor area SA may further include a transmitting area TA in which the pixels PX are not arranged.

As shown in FIG. 27, the pixels PX are not arranged in the transmitting area TA of the sensor area SA. The transmitting area TA may have a stacked structure of the first barrier layer 303, the second support substrate 304, the second barrier layer 311, the insulating interlayer 312, the gate insulating film 321, the insulating interlayer film 322, the first via layer VIA1, the pixel definition film BNK, and the encapsulation layer 360.

In the sensor area SA, the pixels PX may be arranged near the transmitting area TA. That is, an area of the sensor area SA in which the pixels PX are not arranged may be defined as the transmitting area TA. In an exemplary embodiment, in the transmitting area TA, only the insulating layers 303, 304, 311, 312, 321, 322, VIA1, BNK, and 360 are arranged and conductive materials (for example, the semiconductor layer ACT, the light-blocking metal pattern BML, the anode electrode ANO, and the cathode electrode CAT) are not arranged. While FIG. 27 shows portions of the cathode electrode CAT, the anode electrode ANO, and the emissive layer EL extending into the transmitting area TA, in an alternate embodiment, these portions are not present in the transmitting area TA. For example, these portions may be moved to respective nearest pixels PX and the BNK 360 may be extended to respective edges (see dotted lines in FIG. 27) between a pixel PX and the transmitting area TA.

In a display device according to an exemplary embodiment of the present disclosure, a camera or a sensor located in a display area can more easily receive light.

While the present disclosure has been particularly illustrated and described with reference to exemplary embodiments thereof, it will be understood by those of ordinary skill in the art that various changes in form and detail may be made therein without departing from the spirit and scope of the present disclosure.

What is claimed is:

1. A display device including a display area and a non-display area located on a periphery of the display area, the display area including a sensor area for an optical sensor and a non-sensor area, the display device comprising:
   a substrate portion;
   a light-blocking layer disposed in the sensor area on the substrate portion;
   a thin film transistor (TFT) layer disposed over an entire surface of the substrate portion and comprising at least one TFT; and
   a light emitting diode (LED) disposed on the TFT layer,
   wherein the substrate portion comprises a first substrate and a second substrate facing the first substrate,
   at least one of the first substrate and the second substrate comprises an opening in the sensor area of the substrate portion, and
   a thickness of the substrate portion in the sensor area is smaller than a thickness of the substrate portion in the non-sensor area.

2. The display device of claim 1, wherein the substrate portion further comprises a first barrier layer disposed between the first substrate and the second substrate, and the first substrate includes a first flexible substrate and the second substrate includes a second flexible substrate.

3. The display device of claim 2, wherein the first flexible substrate comprises a through hole passing therethrough in the sensor area in a thickness direction and exposes at least part of a bottom surface of the first barrier layer.

4. The display device of claim 3, further comprising a sacrificial pattern directly disposed on a region of the bottom surface of the first barrier layer exposed by the through hole.

5. The display device of claim 3, wherein the exposed part of the bottom surface of the first barrier layer further comprises a carbonized surface, and a coarseness level of the bottom surface of the first barrier layer in the sensor area is greater than a coarseness level of the bottom surface of the first barrier layer in the non-sensor area.

6. The display device of claim 3, wherein the through hole further passes through at least part of the first barrier layer, and a thickness of the first barrier layer in the sensor area is smaller than a thickness of the first barrier layer in the non-sensor area.

7. The display device of claim 6, wherein a coarseness level of the bottom surface of the first barrier layer in the sensor area is greater than a coarseness level of the bottom surface of the first barrier layer in the non-sensor area.

8. The display device of claim 6, wherein the through hole completely passes through the first barrier layer and exposes a bottom surface of the second flexible substrate.

9. The display device of claim 8, wherein the exposed bottom surface of the second flexible substrate further comprises a carbonized surface, and a coarseness level of the bottom surface of the second flexible substrate in the sensor area is greater than a coarseness level of the bottom surface of the second flexible substrate in the non-sensor area.

10. The display device of claim 8, wherein the through hole further passes through at least part of the second flexible substrate, and a thickness of the second flexible substrate in the sensor area is smaller than a thickness of the second flexible substrate in the non-sensor area.

11. The display device of claim 10, wherein a coarseness level of the bottom surface of the second flexible substrate in the sensor area is greater than a coarseness level of the bottom surface of the second flexible substrate in the non-sensor area.

12. The display device of claim 10, further comprising a second barrier layer disposed between the second flexible substrate and the TFT layer, wherein the through hole completely passes through the second flexible substrate and exposes at least part of a bottom surface of the second barrier layer.

13. The display device of claim 12, further comprising a sacrificial pattern directly disposed on a region of the bottom surface of the second barrier layer exposed by the through hole.

14. The display device of claim 12, wherein the exposed bottom surface of the second barrier layer further comprises a carbonized surface, and a coarseness level of the bottom surface of the second barrier layer in the sensor area is greater than a coarseness level of the bottom surface of the second barrier layer in the non-sensor area.

15. The display device of claim 14, wherein the through hole further passes through at least part of the second barrier layer, and a thickness of the second barrier layer in the sensor area is smaller than a thickness of the second barrier layer in the non-sensor area.

16. The display device of claim 2, wherein the TFT layer comprises a semiconductor layer disposed on the substrate portion, a gate electrode disposed on the semiconductor layer, and source/drain electrodes disposed on the gate electrode and each connected to the semiconductor layer, and wherein the light-blocking layer is a metal layer.

17. The display device of claim 1, wherein the light-blocking layer comprises a plurality of light-blocking metal patterns arranged to be spaced apart from each other.

18. The display device of claim 17, wherein the plurality of light-blocking metal patterns are overlapped with the semiconductor layer.

19. The display device of claim 1, wherein the light-blocking layer is a metal layer that comprises titanium (Ti) or molybdenum (Mo).

20. The display device of claim 1, wherein the substrate portion further comprises a burr protruding from a periphery of the sensor area of the substrate portion.

21. The display device of claim 1, wherein the sensor area and the non-sensor area each comprise a plurality of pixels, and a density of the pixels arranged in the sensor area is smaller than a density of the pixels arranged in the non-sensor area.

22. The display device of claim 21, wherein the sensor area comprises a pixel arrangement area, in which the pixels are arranged, and a transmitting area, in which the pixels are not arranged, and wherein a conductive material is not disposed in the transmitting area.

23. A display device including a display area and a non-display area located on a periphery of the display area, the display area including a sensor area for an optical sensor and a non-sensor area, the display device comprising:
a substrate portion comprising a first substrate and a second substrate facing the first substrate;
a light-blocking layer;
a thin film transistor (TFT) layer disposed over an entire surface of the substrate portion and comprising at least one TFT; and
a light emitting diode (LED) disposed on the TFT layer,
wherein a through hole passes entirely through the first substrate and the second substrate and overlaps the light-blocking layer, in the sensor area, in a thickness direction.

24. The display device of claim 23, further comprising:
a barrier layer disposed between the substrate portion and the TFT layer; and
a humidity penetration blocking pattern disposed between the substrate portion and the TFT layer, wherein the humidity penetration blocking pattern comprises silicon oxynitride.

25. The display device of claim 24, wherein the humidity penetration blocking pattern is disposed in and overlapped with the sensor area.

26. A display device including a display area and a non-display area located on a periphery of the display area, the display area including a sensor area for an optical sensor and a non-sensor area, the display device comprising:
a substrate portion;
a thin film transistor (TFT) layer disposed over an entire surface of the substrate portion and comprising at least one TFT; and
a light emitting diode (LED) disposed on the TFT layer,
wherein a through hole passes entirely through opposing surfaces of the substrate portion, in the sensor area, in a thickness direction,
the display device further comprising a barrier layer disposed between the substrate portion and the TFT layer, wherein the barrier layer further comprises a groove protruding further in the thickness direction than the barrier layer in the non-sensor area.

27. The display device of claim 26, wherein the groove comprises a plurality of groove patterns arranged on a periphery of the sensor area.

28. The display device of claim 26, wherein the groove completely surrounds the sensor area in a plan view.

29. The display device of claim 23, further comprising a barrier layer disposed between the first substrate and the second substrate, and the through hole passes entirely through the barrier layer.

30. The display device of claim 1, wherein the light-blocking layer is disposed between the substrate portion and the TFT layer.

31. The display device of claim 23, wherein the light-blocking layer is disposed between the substrate portion and the TFT layer.

* * * * *